United States Patent
Chang et al.

(10) Patent No.: US 10,950,738 B2
(45) Date of Patent: Mar. 16, 2021

(54) CHIP PACKAGE AND METHOD FOR FORMING THE SAME

(71) Applicant: XINTEC INC., Taoyuan (TW)

(72) Inventors: Shu-Ming Chang, New Taipei (TW); Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 16/512,244

(22) Filed: Jul. 15, 2019

(65) Prior Publication Data

US 2020/0044099 A1 Feb. 6, 2020

Related U.S. Application Data

(60) Provisional application No. 62/713,737, filed on Aug. 2, 2018.

(51) Int. Cl.
*H01L 31/0216* (2014.01)
*H01L 33/62* (2010.01)
*H01L 31/14* (2006.01)
*H01L 31/0232* (2014.01)
*H01L 31/18* (2006.01)
*H01L 31/02* (2006.01)

(52) U.S. Cl.
CPC .. *H01L 31/02164* (2013.01); *H01L 31/02002* (2013.01); *H01L 31/02327* (2013.01); *H01L 31/14* (2013.01); *H01L 31/18* (2013.01); *H01L 33/62* (2013.01)

(58) Field of Classification Search
CPC ......... H01L 27/14601; H01L 27/14618; H01L 27/14621; H01L 27/14625; H01L 31/02002; H01L 31/02164; H01L 31/02327; H01L 31/14; H01L 33/62
See application file for complete search history.

(56) References Cited

U.S. PATENT DOCUMENTS

| | | | |
|---|---|---|---|
| 2006/0220025 A1* | 10/2006 | Oh | H01L 27/14636 257/72 |
| 2007/0018263 A1 | 1/2007 | Noma | |
| 2013/0026523 A1 | 1/2013 | Shiu et al. | |
| 2015/0123227 A1 | 5/2015 | Ootsuka et al. | |
| 2016/0013118 A1* | 1/2016 | Tsai | H01L 23/481 257/774 |
| 2017/0077158 A1 | 3/2017 | Huang et al. | |
| 2019/0229141 A1* | 7/2019 | Kim | H01L 27/14605 |

FOREIGN PATENT DOCUMENTS

| | | |
|---|---|---|
| TW | 200802834 | 1/2008 |
| TW | 201306185 | 2/2013 |
| TW | 201403802 | 1/2014 |
| TW | 201711148 | 3/2017 |

* cited by examiner

*Primary Examiner* — Allan R Wilson
(74) *Attorney, Agent, or Firm* — Liu & Liu

(57) ABSTRACT

A chip package is provided. the chip package includes a substrate having an upper surface, a lower surface, and a sidewall surface that is at an edge of the substrate. The substrate includes a sensing device adjacent to the upper surface of the substrate to sense a light source. The chip package also includes a first color filter layer disposed on the upper surface of the substrate to shield the light source. The first color filter layer includes an opening, so that the first color filter layer surrounds the sensing device via the opening. In addition, the chip package includes a redistribution layer disposed on the lower surface of the substrate. A method of forming the chip package is also provided.

17 Claims, 15 Drawing Sheets

CHIP PACKAGE AND METHOD FOR FORMING THE SAME

CROSS REFERENCE TO RELATED APPLICATIONS

This application claims the benefit of U.S. Provisional Application No. 62/713,737 filed on Aug. 2, 2018, the entirety of which is incorporated by reference herein.

BACKGROUND OF THE INVENTION

Field of the Invention

The invention relates to semiconductor package technology, and in particular to a chip package with a light filter structure and methods for forming the same.

Description of the Related Art

Optoelectronic devices (e.g. an image sensing device) play an important role in capturing images and have been widely used in electronic products such as digital cameras, digital video recorders, and mobile phones. The chip packaging process is an important step in the fabrication of electronic products. Chip packages not only protect the sensing chips therein from outer environmental contaminants but also provide electrical connection paths between the electronic elements inside and those outside of the chip packages.

For sensing chip packages, optical crosstalk, is one event negatively affecting image quality thereof. When optical crosstalk is serious, images of a conventional image sensor are distorted. For example, optical crosstalk problems may occur when infrared (IR) light, incident to a non-photosensitive region would passes through a silicon substrate and into a sensing region of an image sensor. As a result, the image quality of sensing chip packages is decreased due to noise induced in the sensing region of the sensor.

Accordingly, there is a need for a novel chip package and methods for forming the same capable of eliminating or mitigating the aforementioned problems.

BRIEF SUMMARY OF THE INVENTION

An embodiment of the invention provides a chip package which includes a substrate having an upper surface, a lower surface, and a sidewall surface that is at an edge of the substrate. The substrate includes a sensing device adjacent to the upper surface of the substrate to sense a light source. The chip package also includes a first color filter layer disposed on the upper surface of the substrate to shield the light source. The first color filter layer includes an opening, so that the first color filter layer surrounds the sensing device via the opening. In addition, the chip package includes a redistribution layer disposed on the lower surface of the substrate.

An embodiment of the invention provides a method for forming a chip package which includes providing a substrate. The substrate has an upper surface and a lower surface, and includes a chip region and a scribe line region surrounding the chip region. The chip region of the substrate includes a sensing device adjacent to the upper surface of the substrate to sense a light source. The method also includes forming a first color filter layer on the upper surface of the substrate to shield the light source and forming an opening in the first color filter layer, so that the first color filter layer surrounds the sensing device via the opening. In addition, the method includes forming a redistribution layer on the lower surface of the substrate.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or spaced apart from the second material layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of wafers having integrated circuits.

Figure 1:
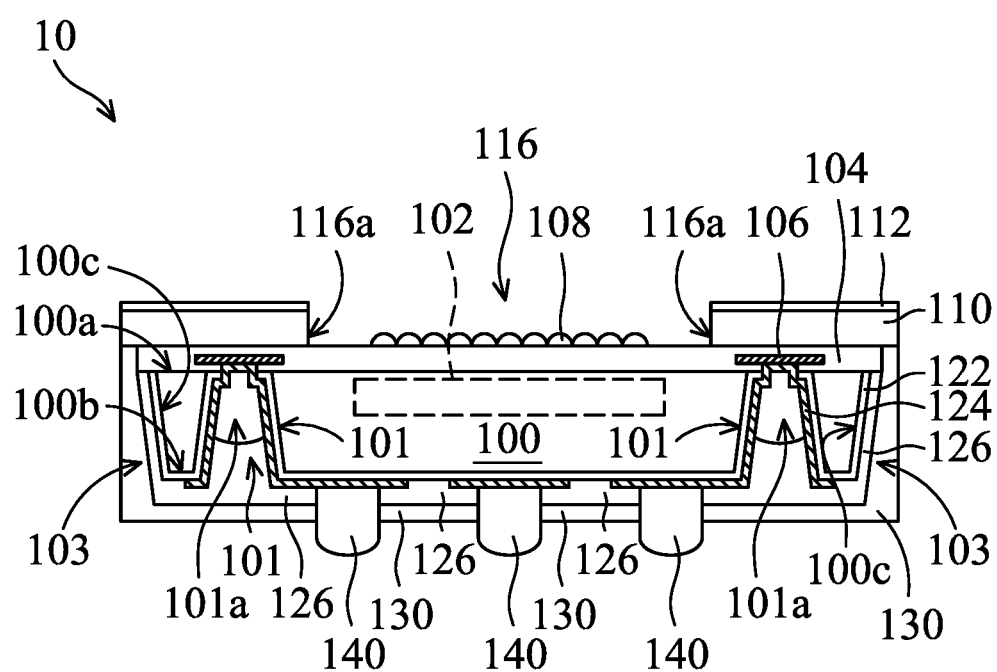
FIG. 1 is a cross-sectional view of a chip package according to some embodiments of the invention.

Refer to FIG. 1, which illustrates a cross-sectional view of an exemplary embodiment of a chip package 10 according to the invention. In some embodiments, the chip package 10 includes a substrate 100. The substrate 100 may be formed of silicon or another semiconductor material. The substrate 100 has an upper surface 100a, a lower surface 100b opposite to the upper surface 100a, and a sidewall surface 100c at the edge of the substrate 100. Moreover, the substrate 100 includes a sensing region 102 therein. The sensing region 102 may be adjacent to the upper surface 100a and include a sensing device (not shown) therein. For example, the sensing region 102 includes an image sensing device for sensing a light source (not shown), such as visible light or infrared (IR) light. In some other embodiments, the sensing region 102 may include a device that is configured to sense biometrics (e.g., a fingerprint recognition device), or another suitable sensing element.

In some embodiments, an insulating layer 104 is disposed on the upper surface 100a of the substrate 100. A chip/die may be comprised of the insulating layer 104 and the substrate 100. Moreover, the insulating layer 104 may be formed of an interlayer dielectric (ILD) layer, an inter-metal dielectric (IMD) layer, a passivation layer or a combination thereof. To simplify the diagram, only a single insulating layer 104 is depicted herein. In some embodiments, the insulating layer 104 comprise an inorganic material, such as silicon oxide, silicon nitride, silicon oxynitride, metal oxide, or a combination thereof, or another suitable insulating material.

In some embodiments, the insulating layer 104 includes one or more conductive pads 106 therein and is adjacent to the upper surface 100a. In some embodiments, the conductive pad 106 may be formed of a single conductive layer or multiple conductive layers. To simplify the diagram, only few conductive pads 106 including a single conductive layer are depicted herein as an example. In some embodiments, the insulating layer 104 has openings therein to expose corresponding conductive pads 106. In some embodiments, the sensing device in the sensing region 102 is electrically connected to the conductive pad 106 via interconnect structures (not shown) in the substrate 100 and the insulating layer 104.

In some embodiments, an opening 103 extends from the lower surface 100b of the substrate 100 to the upper surface 100a of the substrate 100, so that the opening 103 passes through the substrate 100 and the insulating layer 104. Moreover, the opening 103 extends along the edges of the substrate 100 to surround the sensing region 102. In those cases, the opening 103 has an inclined sidewall. That is, the substrate 100 of the chip has inclined sidewall surfaces 100c. In some embodiments, one or more openings 101 extend from the lower surface 100b of the substrate 100 to the upper surface 100a of the substrate 100, so that the openings 101 pass through the substrate 100 and correspond to the openings in the insulating layer 104 so as to expose the corresponding conductive pads 106.

In some embodiments, a first diameter of the openings 101 adjacent to the lower surface 100b (i.e., the lower width of the openings 101) is greater than a second diameter of the openings 101 adjacent to the upper surface 100a (i.e., the upper width of the openings 101). As a result, the openings 101 also have inclined sidewalls. However, The top-view profile of the openings 101 may be different from that of the opening 103. For example, the top-view profile of the openings 101 is circular while the top-view profile of the opening 103 is ring-shaped, such as rectangular ring-shaped. It should be realized that the top-view profiles of the openings 101 and the opening 103 may be another shape, and they are not limited thereto.

In some embodiments, the chip package 10 further includes an optical element 108 disposed on the insulating layer 104 and corresponding to the sensing region 102. In some embodiments, the optical element 108 may comprise a microlens array or another suitable optical element.

In some embodiments, the chip package 10 further includes a color filter layer 110 disposed on the upper surface 100a of the substrate 100 and in direct contact with the insulating layer 104. The color filter includes an opening 116, so that the color filter 110 surrounds the sensing region 102 (and the sensing device therein) via the opening 116. Moreover, the optical element 108 disposed on the insulating layer 104 is also disposed in the opening 116 of the color filter layer 110. In some embodiments, the color filter layer 110 is employed to block and/or absorb the exterior light source that can be sensed by the sensing device formed in the substrate 100. For example, the color filter layer 110 may be a light-shielding layer made of an opaque material (such as a metal material (e.g., aluminum, titanium, tungsten, copper or a combination thereof), a black insulating material (e.g., photoresist or polyimide) or another suitable material) when such a light source is a visible light source. The color filter layer 110 may be made of an organic material, an inorganic material or a combination thereof when such a light source is an infrared (IR) light source. For example, the color filter layer 110 is an IR cut film.

In some embodiments, the chip package 10 further includes a protective layer 112 that covers the color filter layer 110 to prevent the color filter layer 110 from damage. The protective layer 112 includes an opening corresponding to the opening 116 of the color filter layer 110, so that the protective layer 112 surrounds the sensing region 102 (and the sensing device therein) of the substrate 100 via the opening of the protective layer 112. In some other embodiments, the protective layer extends onto the sidewalls 116a of the opening 116. In some embodiments, the protective layer 112 includes silicon oxide, silicon nitride, or a combination thereof, or another suitable high hardness material.

In some embodiments, the chip package 10 further includes an insulating liner 122 disposed on the lower surface 100b of the substrate 100 and conformally extending into the opening 103 and the openings 101, so that the insulating liner 122 extends onto the sidewall surface 100c of the substrate 100. Moreover, the insulating liner 122 in each opening 101 has an opening exposing the conductive pad 106. In some embodiments, the insulating liner 122 includes epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In some embodiments, the chip package 10 further includes a patterned redistribution layer 124 disposed on the insulating liner 122 that is on the lower surface 100b of the substrate 100, so that the insulating liner 122 is between the redistribution layer 124 and the substrate 100. In some embodiments, the redistribution layer 124 extends from the lower surface 100b toward the upper surface 100a of the substrate 100, so as to be conformally formed on the sidewall and the bottom of the openings 101. However, the redistribution layer 124 does not extend into the opening 103. The redistribution layer 124 is electrically isolated from the substrate 100 via the insulating liner 122 and is in direct electrical contact with or indirectly electrically connected to the exposed conductive pads 106 through the openings 101. Therefore, the redistribution layer 124 in the openings 101 are also referred to as through substrate vias (TSVs). The redistribution layer 124 may be formed of a single layer or multiple layers. To simplify the diagram, only a single conductive layer is depicted herein as an example. In some embodiments, the redistribution layer 124 may include aluminum, titanium, tungsten, copper, nickel, gold or a combination thereof.

In some embodiments, the chip package 10 further includes a passivation layer 126 disposed on the lower surface 100b of the substrate 100, and fills the openings 101 and the opening 103 to cover the redistribution layer 124. Moreover, the passivation layer 126 includes openings to expose portions of the redistribution layer 124. In some embodiments, the passivation layer 126 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In some embodiments, the openings 101 are not fully filled with the passivation layer 126, so that a hole 101a is formed between the redistribution layer 124 and the passivation layer 126 within each opening 101. Therefore, the hole 101a can be a buffer between the redistribution layer 124 and the passivation layer 126 in thermal cycles induced in subsequent processes. Unwanted stress, which is induced between the redistribution layer 124 and the passivation layer 126 as a result of mismatch of thermal expansion coefficients, is reduced. The redistribution layer 124 is prevented from being excessively pulled by the passivation layer 126 when external temperature or pressure dramatically changes. As a result, problems such as peeling or disconnection of the redistribution layer 124, which is close to the conducting pad structure, are avoidable. In some embodiments, the interface between the passivation layer 126 and the hole 101a has an arcuate contour.

In some embodiments, the chip package 10 further includes an optional color filter layer 130 that covers the redistribution layer 124 and the passivation layer 126 over the redistribution layer 124. In some embodiments, the color filter layer 130 extends into the opening 103 of the substrate 100 from the lower surface 100b of the substrate 100, so as to cover the sidewall surface 100c of the substrate 100. Moreover, the color filter layer 130 may be in direct contact with the portion of the color filter layer 110 that laterally protrudes from the sidewall surface 100c of the substrate 100. As a result, the substrate 100 is substantially covered by the color filter layers 110 and 130 except the sensing region 102. The color filter 130 includes openings corresponding to the openings of the passivation layer 126 to expose the redistribution layer 124. Similar to the color filter layer 110, the color filter layer 130 is employed to shield the exterior light source that can be sensed by the sensing device formed in the substrate 100.

In some other embodiments, the passivation layer 126 is made of a material that is the same as that of the color filter layer 130. In those cases, the chip package 10 may have no color filter layer 130 formed therein. Yet in some other embodiments, the color filter layer 130 and the redistribution layer 124 are formed by defining the same material layer (e.g., a metal layer), so that the color filter layer 130 and the redistribution layer 124 are between the insulating liner 122 and the passivation layer 126 and separated from each other. Further, in some other embodiments, the color filter layer 130 is disposed on the insulating liner 122 that is on the lower surface 100b of the substrate 100, so that the color filter layer 130 is between the insulating liner 122 and the redistribution layer 124.

In some embodiments, the chip package 10 further includes conductive structures 140 (such as solder balls, bumps or conductive pillars) correspondingly disposed in the openings of the passivation layer 126 and the color filter layer 130, so as to be electrically connected to the exposed redistribution layer 124. In some embodiments, the conductive structures 140 include tin, lead, copper, gold, nickel, or a combination thereof. In some embodiments, the chip package 10 with the conductive structures 140 is a ball grid array (BGA) package. However, in some other embodiments, there are no conductive structures 140 formed in the chip package 10. In those cases, the chip package 10 is a land grid array (LGA) package.

In some embodiments mentioned above, the chip package 10 includes a front side illumination (FSI) sensing device. However, in other embodiments, the chip package 10 includes a back side illumination (BSI) sensing device.

Figure 2A:
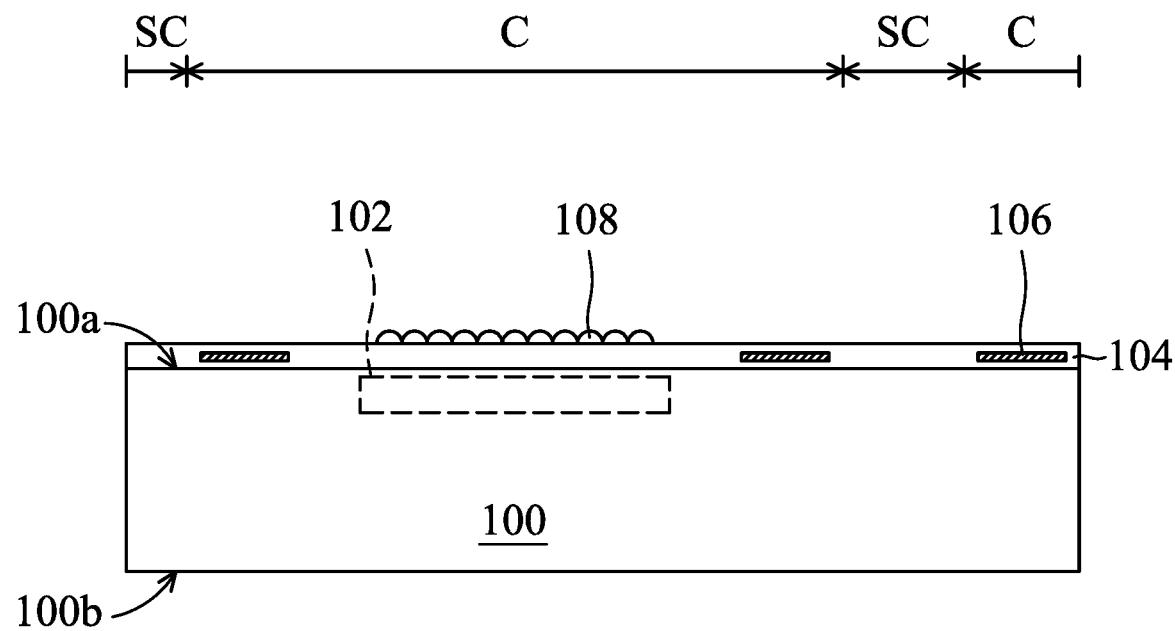
FIGS. 2A to 2J are cross-sectional views of a method for forming a chip package according to some embodiments of the invention.

FIGS. 2A to 2J are cross-sectional views of an exemplary embodiment of a method for forming a chip package 10 according to the invention. Elements in FIGS. 2A to 2J that are the same as those in FIG. 1 are labeled with the same reference numbers as in FIG. 1 and are not described again for brevity. Refer to FIG. 2A, a substrate 100 is provided. The substrate 100 has an upper surface 100a and a lower surface 100b opposite thereto. The substrate 100 may include chip regions and a scribe line region that surrounds the chip regions and separates the adjacent chip regions from each other. To simplify the diagram, only a complete chip region C, an incomplete chip region C adjacent thereto, and a scribe line region SC separating these chip regions C are depicted herein. In some embodiments, the substrate 100 is a silicon wafer so as to facilitate the wafer-level packaging process. In some other embodiments, the substrate 100 is a silicon substrate or another semiconductor substrate.

The chip regions C of the substrate 100 include a sensing region 102 and the sensing region 102 may be adjacent to the upper surface 100a of the substrate 100. Moreover, the sensing region 102 may include a sensing device (not shown) therein for sensing a light source (not shown). In some embodiments, an insulating layer 104 includes one or more conductive pads 106 therein. The conductive pads 106 correspond to the chip regions C of the substrate 100 and are adjacent to the upper surface 100a of the substrate 100. In some embodiments, the sensing device in the sensing region 102 is electrically connected to the conductive pad 106 via interconnect structures (not shown) in the substrate 100 and the insulating layer 104.

In some embodiments, the aforementioned structure may be fabricated by sequentially performing a front-end process (for example, the sensing region 102 is formed in the substrate 100) and a back-end process (for example, the insulating layer 104, the interconnection structures, and the conductive pads 106 are formed on the substrate 100) of a semiconductor device. In other words, the following method for forming a chip package includes subsequent packaging processes performed on the substrate after the back-end process is finished.

In some embodiments, an optical element 108 is formed on the insulating layer 104 on the upper surface 100a of the substrate 100, and corresponds to the sensing region 102.

Figure 2B:
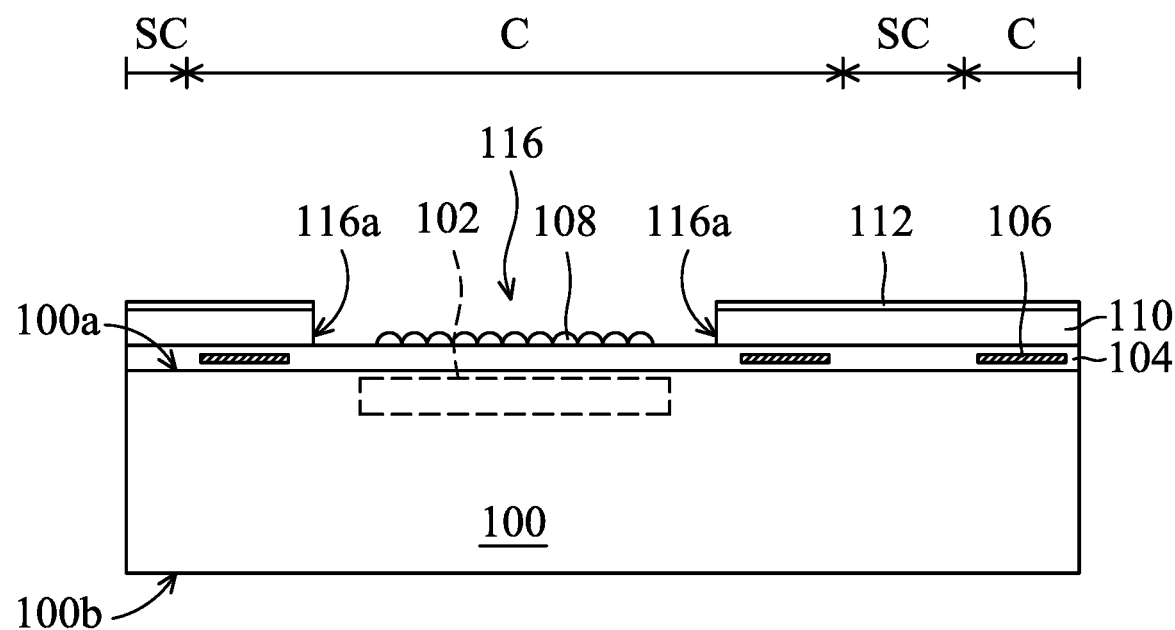

Refer to FIG. 2B, a color filter layer 110 and a protective layer 112 are successively formed on the upper surface 100a of the substrate 100. In some embodiments, the color filter layer 110 and the protective layer 112 are formed by a deposition process (such as coating process, a physical vapor deposition process, a chemical vapor deposition process or another suitable process). The color filter layer 110 is employed to shield and/or absorb the exterior light source that can be sensed by the sensing device formed in the substrate 100. The color filter includes an opening 116, so that the color filter 110 surrounds the sensing region 102 via the opening 116. In some embodiments, the color filter layer 110 has a thickness of about 1000 Å. The protective layer 112 also includes an opening corresponding to the opening 116, so that the protective layer 112 surrounds the sensing region 102 of the substrate 100 via the opening of the protective layer 112.

In some embodiments, after the color filter layer 110 and the protective layer 112 are successively formed, a patterning process (such as lithography and etching processes) is performed, so as to form the opening in the protective layer and the opening 116 in the color filter layer 110, and expose the optical element 108 and the insulating layer 104 corresponding to the sensing region 102.

In some embodiments, after the color filter layer 110 is formed, a patterning process is performed, so as to form the opening 116 is formed in the color filter layer 110, and expose the optical element 108 and the insulating layer 104 corresponding to the sensing region 102. Afterwards, the protective layer 112 is formed on the color filter layer 110 to cover the sidewalls 116a of the opening 116 and the exposed optical element 108 and the exposed insulating layer 104. Next, a patterning process is performed to remove the portion of the protective layer 112 covering the optical element 108 and the insulating layer 104, so that the remaining protective layer 112 extends on the sidewalls 116a of the opening 116 of the color filter layer 110.

Figure 2C:
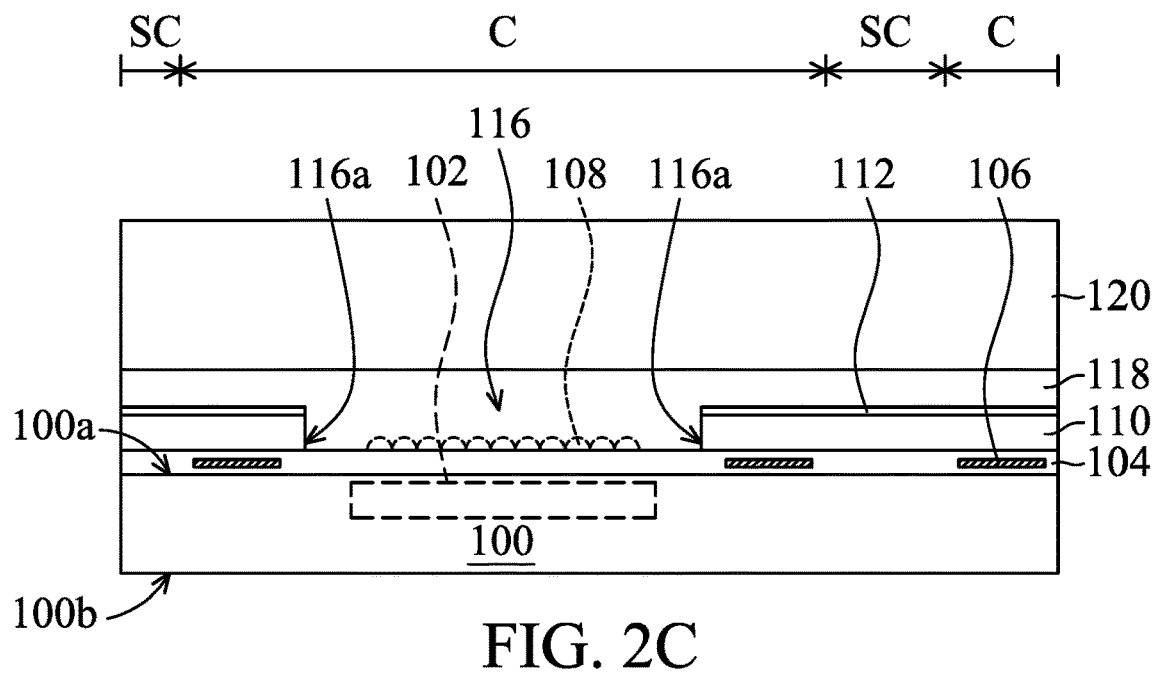

Refer to FIG. 2C, in some embodiments, a temporary cover plate 120 is provided. In some embodiments, the temporary cover plate 120 is employed to provide functions of protection and support and is made of a glass substrate, a silicon substrate, or another suitable substrate material. Afterwards, the temporary cover plate 120 is bonded onto the substrate 100 via a temporary adhesive layer 118 (such as a removable tape). The temporary adhesive layer 118 formed between the temporary cover plate 120 and the substrate 100 entirely covering the optical element 108 and the upper surface 100a of the substrate 100, so that there is no cavity formed between the substrate 100 and the temporary cover plate 120. Next, a thinning process (such as an etching process, a milling process, a grinding process or a polishing process) is performed on the lower surface 100b of the substrate 100 by using the temporary cover plate 120 as a carrier substrate, to reduce the thickness of the substrate 100. In some embodiments, the substrate has a thickness in a range from about 100 μm to about 200 μm after the thinning process.

Figure 2D:
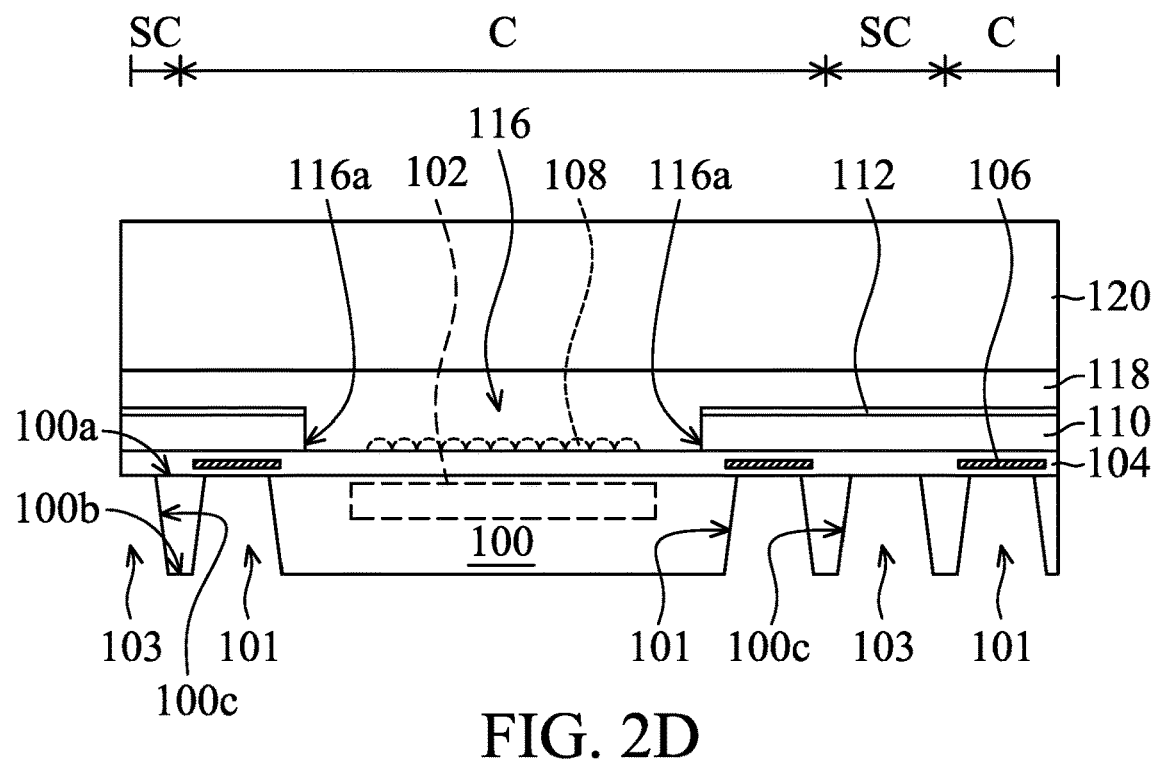

Refer to FIG. 2D, in some embodiments, openings 101 are formed in the substrate 100 at each of the chip regions C by a lithography process and an etching process (such as a dry etching process, a wet etching process, a plasma etching process, a reactive ion etching process, or another suitable process). In some embodiments, an opening 103 is formed in the substrate 100 at the scribe line region SC by a notching process. The openings 101 and the opening 103 extend from the lower surface 100b of the substrate 100 toward the upper surface 100a of the substrate 100 to pass through the substrate 100, in which the openings 101 expose the conductive pads 106 and the opening 103 expose the insulating layer 104. In some embodiments, the opening 103 extends along the scribe line region SC between the adjacent chip regions C to surround the chip region C, so that the substrate 100 in each of the chip regions C are separated from each other. The opening 103 has inclined sidewalls, so that the substrate 100 in each of the chip regions C has an inclined sidewall surface 100c.

In some embodiments, the openings 101 are in the substrate 100 at the chip regions C and correspond to the conductive pads 106. The openings 101 have inclined sidewalls. The inclined sidewalls contribute to reduce the difficulty of the process for subsequently forming layers (e.g., insulating layer and redistribution layer) in the openings 101, and reliability of the chip package is improved. In some embodiments, these openings 101 in the chip region C are arranged apart along the opening 103. The openings 101 and the opening 103 are spaced apart from each other by a portion of the substrate 100.

Figure 2E:
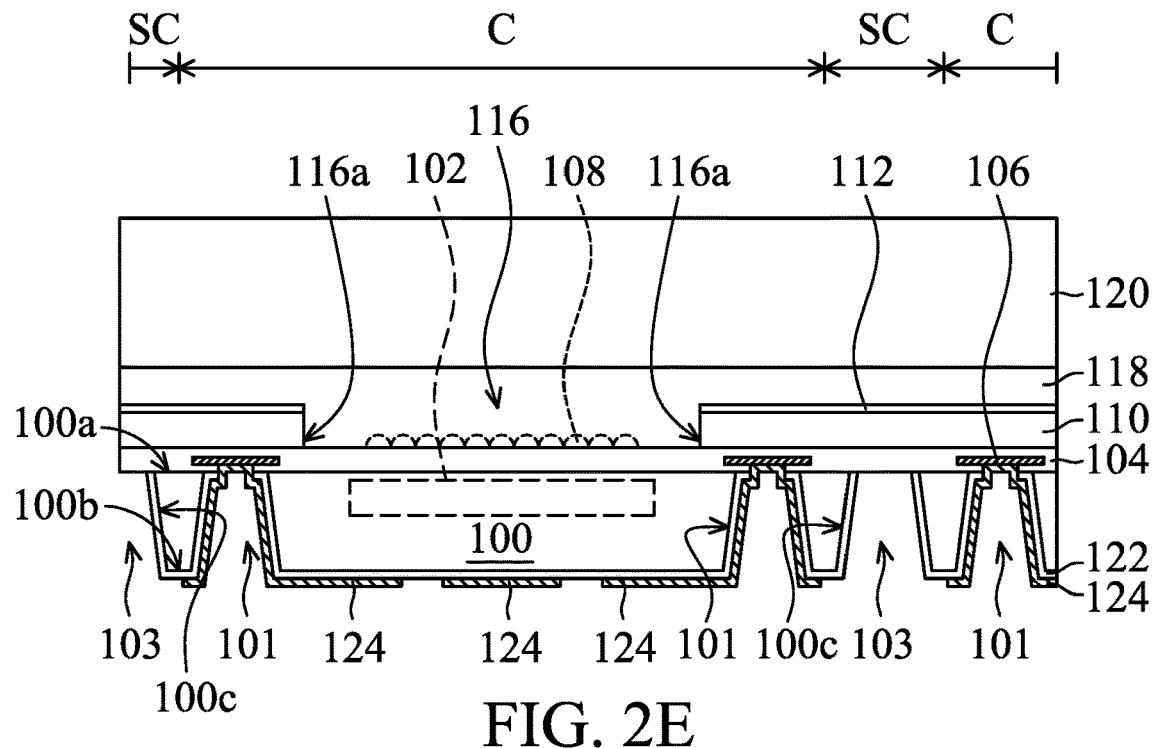

Refer to FIG. 2E, in some embodiments, an insulating liner 122 is formed on the lower surface 100b of the substrate 100 by a deposition process (such as a coating process, a physical vapor deposition process, a chemical vapor deposition process or another suitable process). The insulating liner 122 is conformally deposited to the sidewall surfaces and the bottom surfaces of the openings 101 and the opening 103, so that the insulating liner 122 extends onto the sidewall surface 100c of the substrate 100. In some embodiments, the insulating liner 122 includes epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material. Afterwards, the insulating liner 122 on the bottoms of the openings 101 and the opening 103 are removed by lithography and etching processes. Moreover, the insulating layer 104 at the bottom of each opening 101 is further removed to expose the conductive pads 106.

Next, a patterned redistribution layer 124 is formed on the insulating liner 122 by successively performing a deposition process (such as a coating process, a physical vapor deposition process, a chemical vapor deposition process, a plating process, an electroless plating process or another suitable process), a lithography process, and an etching process. For example, a patterned aluminum layer is formed by successively performing a deposition process, a lithography process, and an etching process. Afterwards, a patterned nickel layer and a patterned metal are successively formed on the patterned aluminum layer by a similar method, so that the stack of the aluminum layer, the nickel layer, and the metal form the patterned redistribution layer 124. As a result, the insulating liner 122 is formed between the patterned redistribution layer 124 and the lower surface 100b of the substrate 100. In some embodiments, the patterned redistribution layer 124 is formed on the lower surface 100b of the substrate 100 and conformally extends onto the sidewall surfaces and bottom surfaces of the openings 101 and does not extend into the opening 103.

Figure 2F:
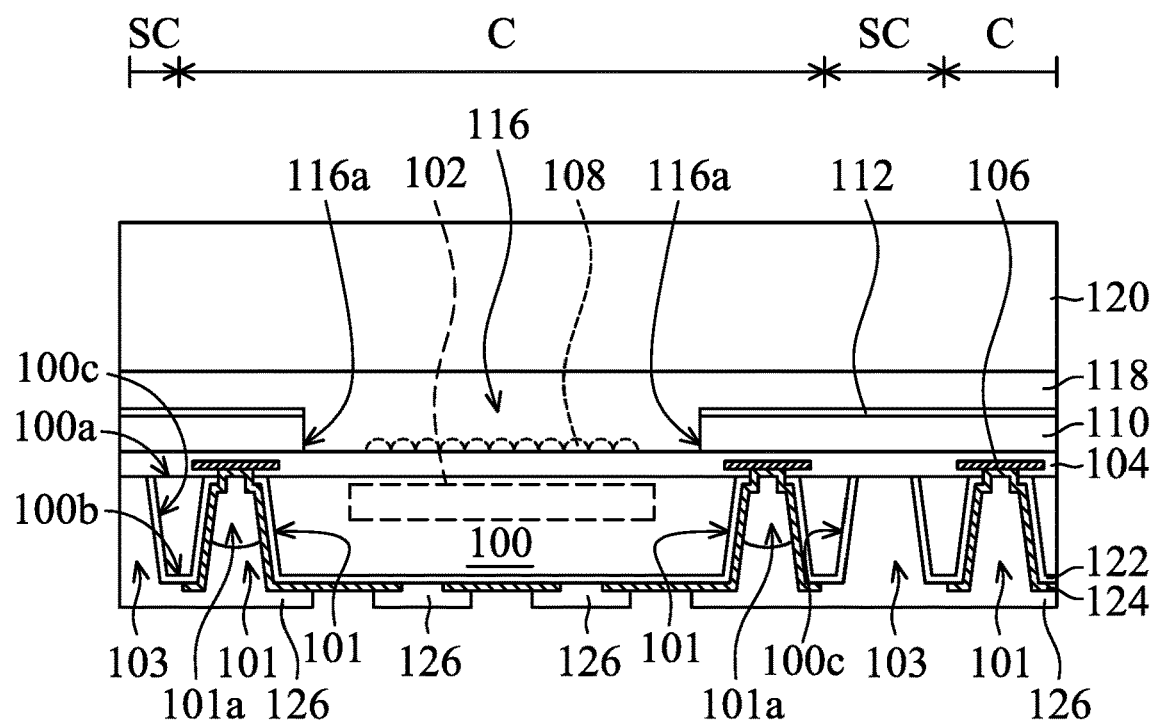

Refer to FIG. 2F, in some embodiments, a passivation layer 126 is formed over the lower surface 100b of the substrate 100 and fills the openings 101 and the opening 103 by a deposition process, so as to cover the redistribution layer 124. In some embodiments, the passivation layer 126 entirely fills the opening 103 and partially fills the openings 101, so that a hole 101a is formed between the redistribution layer 124 and the passivation layer 126 in each opening 101. In some other embodiments, the passivation layer 126 entirely fills the openings 101. Afterwards, openings are formed in the passivation layer 126 on the lower surface 100b of the substrate 100 by a lithography process and an etching process to expose portions of the redistribution layer 124.

Figure 2G:
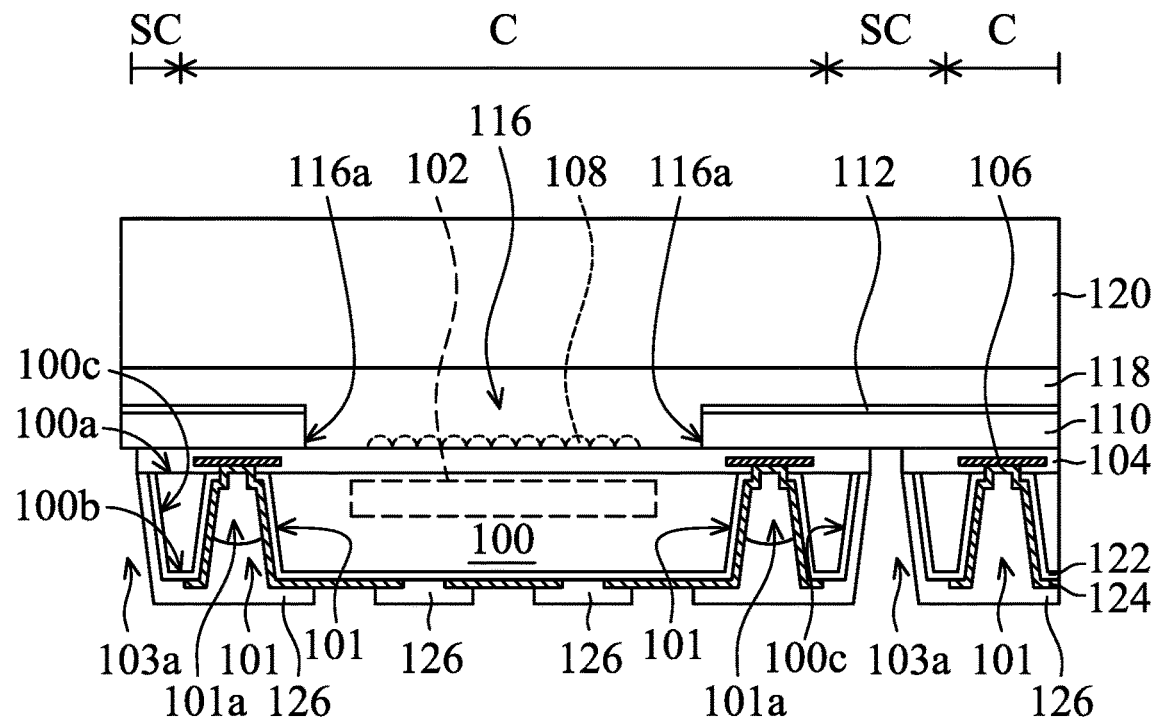

Refer to FIG. 2G, in some embodiments, an opening 103a is formed in the passivation layer 126 that is in the opening 103 by lithograph and etching processes, so as to expose the insulating layer 104. Afterwards, the opening 103 may further extend into the insulating layer 104 by an etching process, so as to expose the color filter layer 110.

Figure 2H:
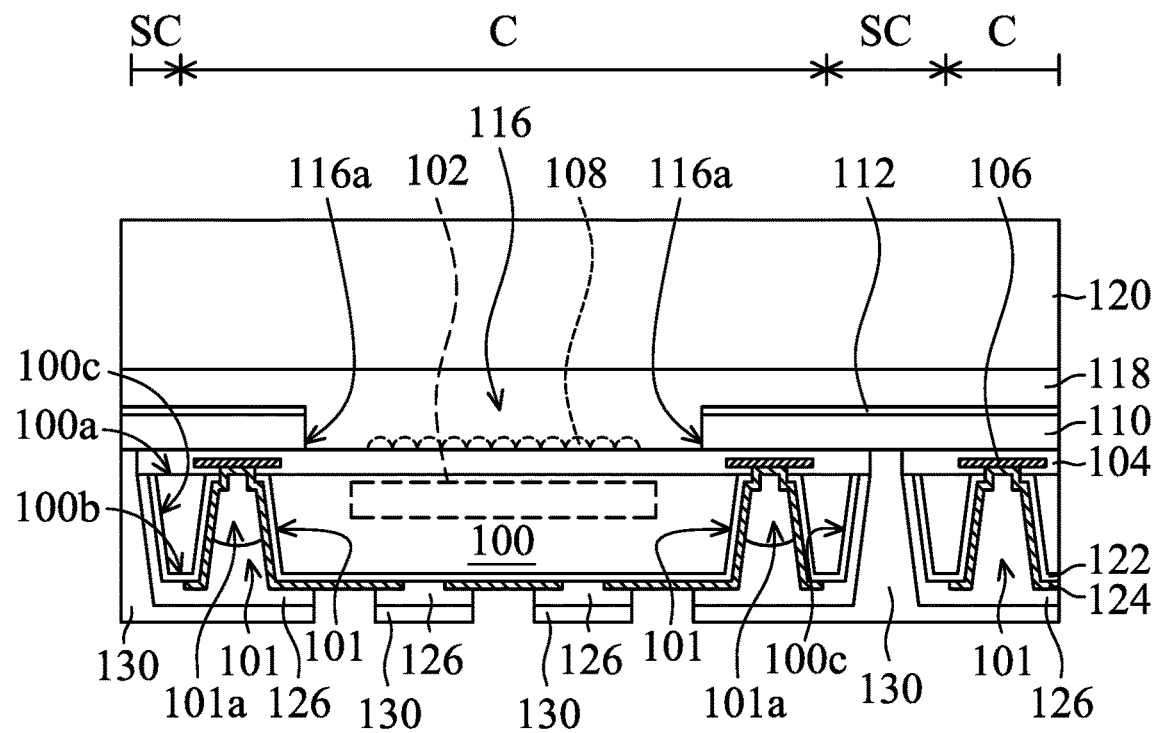

Refer to FIG. 2H, an optional color filter layer 130 is formed on the passivation layer 126 and the redistribution layer 124 and extends into the opening 103a (as indicated in FIG. 2G) by a deposition process (such as a coating process, a physical vapor deposition process, a chemical vapor deposition process, or another suitable process), so as to be in contact with the color filter layer 110. As a result, the passivation layer 126 is formed between the redistribution layer 124 and the color filter layer 130. Afterwards, openings are formed in the color filter layer 130 by lithography and etching processes. These openings correspond to the openings that are in the passivation layer 126 and expose the redistribution layer 124.

Figure 2I:
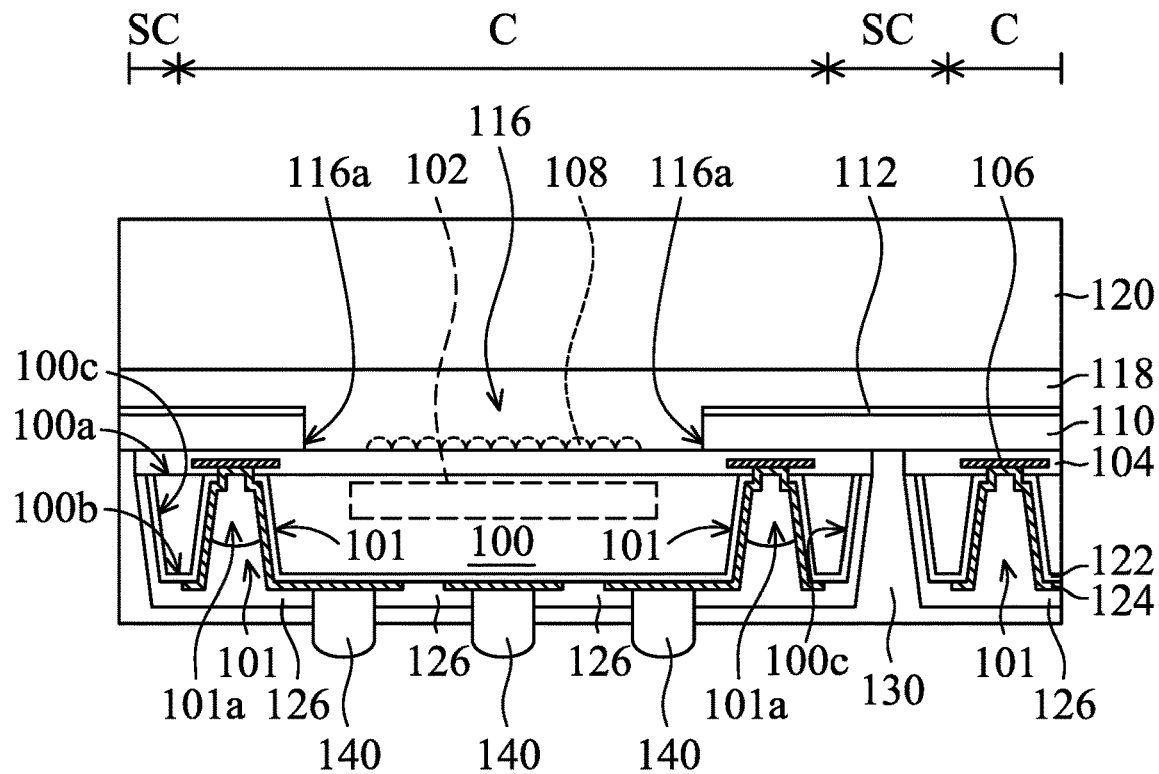
Figure 2J:
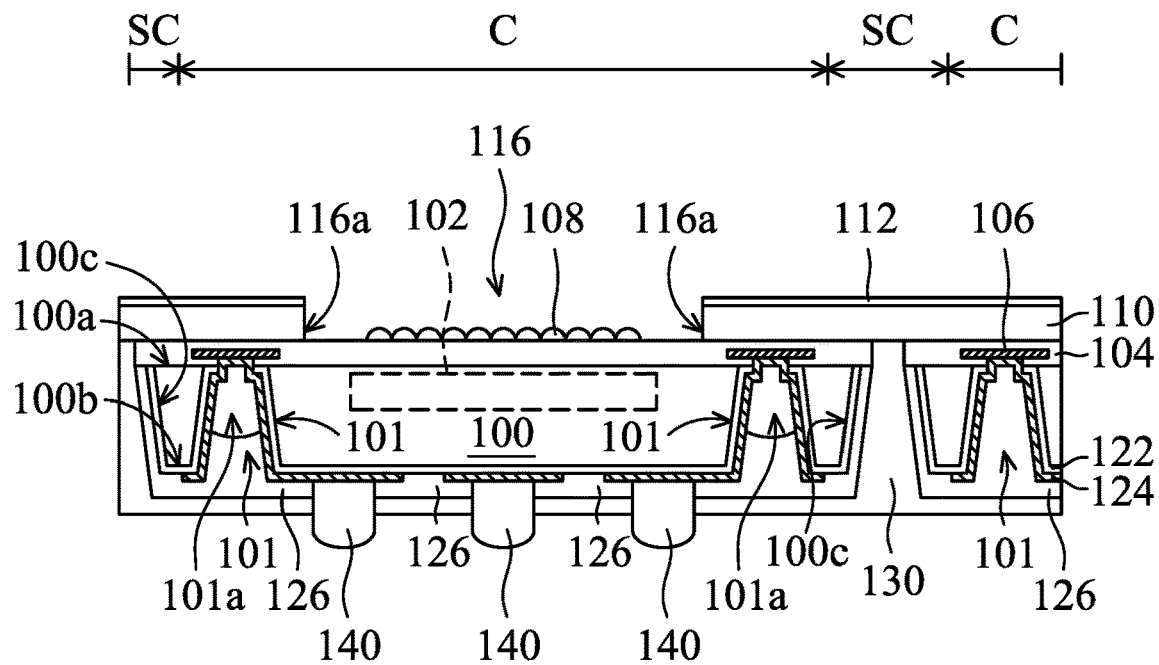

Refer to FIG. 2I, in some embodiments, conductive structures 140 (such as solder balls, bumps or conductive pillars) are filled in the openings of the color filter layer 130 and the passivation layer 126 by a plating process, a screen printing process or another suitable process to electrically connect to the exposed redistribution layer 124. Afterwards, the temporary adhesive layer 118 and the temporary cover plate 120 are removed from the insulating layer 104 and the protective layer 112 on the substrate 100, as shown in FIG. 2J. In some other embodiments, there are not conductive structures 140 formed in the openings in color filter layer 130 and the passivation layer 126. Therefore, after the openings are formed in the color filter layer 130, the temporary adhesive layer 118 and the temporary cover plate 120 are removed.

After the temporary adhesive layer 118 and the temporary cover plate 120 are removed, the substrate 100 at the scribe line region SC and the films (such as the color filter layers 110 and 130 and the protective layer 112) overlying and underlying the substrate 100 at the scribe line region SC are diced, thereby separating the substrate 100 in each of the chip regions C. For example, a dicing saw or laser may be used to perform the dicing process. After the dicing process is performed, individual chip packages 10 are formed, as shown in FIG. 1.

It should be realized that although the embodiments of FIGS. 2A to 2J provide a method for forming a chip package with an FSI sensing device, the method for forming the external electrical connection paths of the chip (such as the opening in the substrate, the redistribution layer, the protective layer, or the conductive structures therein) can be implemented to the processes of a BSI sensing device.

Figure 3:
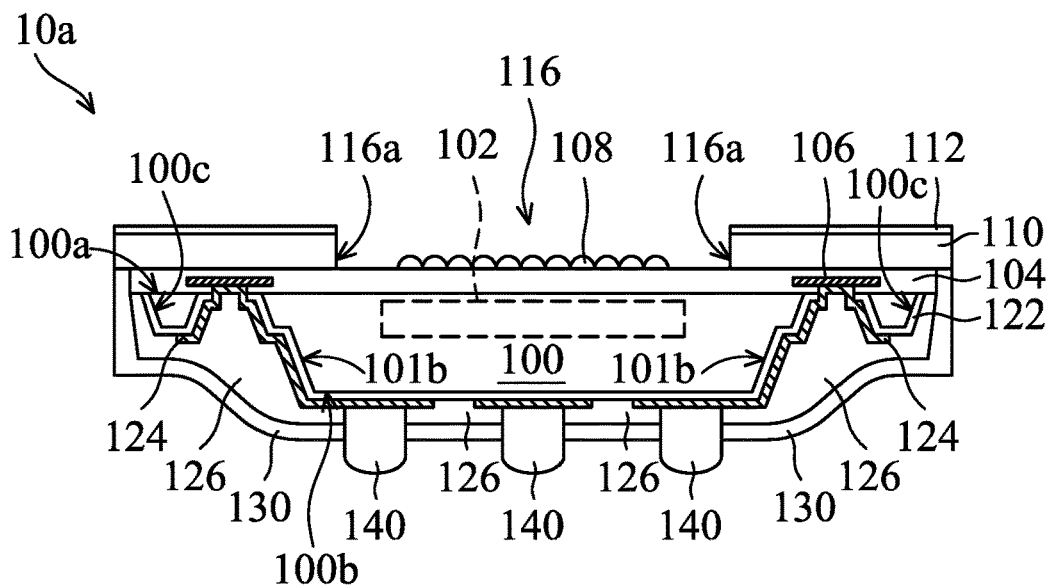
FIG. 3 is a cross-sectional view of a chip package according to some embodiments of the invention.

Refer to FIG. 3, which is cross-sectional view of a chip package 10a according to some embodiments of the invention. Elements in FIG. 3 that are the same as those in FIG. 1 are labeled with the same reference numbers as in FIG. 1 and are not described again for brevity. In some embodiments, the structure of the chip package 10a is similar to the structure of the chip package 10 shown in FIG. 1. The difference is that the chip package 10a has openings 101b formed in the substrate 100 and exposing the conductive pads 106, and each opening 101a has a sidewall with a multi-step profile. Moreover, in the opening 101, the height of the sidewall with the multi-step profile is greater than the height of the sidewall surface 100c of the substrate 100. Therefore, the openings 101b is helpful for subsequently forming layers be filled therein. Moreover, it is capable of avoiding a buildup of stress between the openings 101 and the sidewall surface 100c of the substrate 100, thereby preventing the sidewall surface 100c of the substrate 100 from being cracked. In some embodiments, the openings 101b has a two-step profile, as shown in FIG. 3.

In some embodiments, the passivation 126 is made of a material that is the same as the material of the color filter layer 130. In those cases, the chip package 10a may not include the color filter layer 130. In some other embodiments, the color filter layer 130 and the redistribution layer 124 are formed by defining the same material (e.g., metal) layer, so that the color filter layer 130 and the redistribution layer 124 are formed between the insulating liner 122 and the passivation layer 126 and separated from each other.

In some embodiments mentioned above, the chip package 10a includes an FSI sensing device. However, in other embodiments, the chip package 10a includes a BSI sensing device.

Figure 4:
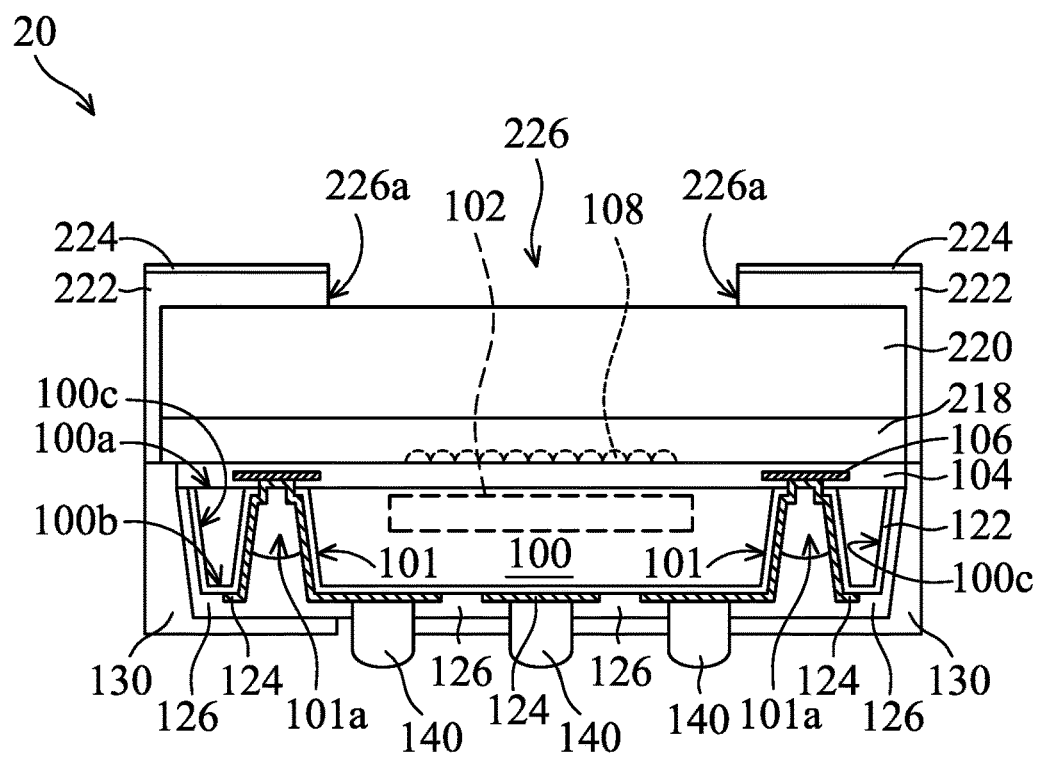
FIG. 4 is a cross-sectional view of a chip package according to some embodiments of the invention.

Refer to FIG. 4, which is cross-sectional view of a chip package 20 according to some embodiments of the invention. Elements in FIG. 4 that are the same as those in FIG. 1 are labeled with the same reference numbers as in FIG. 1 and are not described again for brevity. In some embodiments, the structure of the chip package 20 is similar to the structure of the chip package 10 shown in FIG. 1. The difference is that the chip package 20 further includes an adhesive layer 218 and a cover plate 220 that are successively disposed on the upper surface 100a of the substrate 100, so as to cover the optical element 108, the insulating layer 104, and the sensing device of the substrate 100. As a result, the adhesive layer 218 is disposed between the upper surface 100a of the substrate 100 and the cover plate 220.

In some embodiments, the adhesive layer 218 includes adhesion glue or another adhesive material. In some other embodiments, the adhesive layer 218 includes a high transparent material, so as to increase the sensitivity of the sensor module.

In some embodiments, the cover plate 220 includes glass, sapphire, plastic, or another suitable material.

Further, unlike to the structure of the chip package 10 shown in FIG. 1, a color filter layer 222 is disposed on and in direct contact with the cover plate 220. In some embodiments, the color filter layer 222 has an opening 226, so that the color filter layer 222 surrounds the sensing region 102 (and the sensing device) of the substrate 100 via the opening 226. As a result, the cover plate 220 is between the adhesive layer 218 and the color filter layer 222. In some embodiments, the color filter layer 222 extends on the sidewalls of the adhesive layer 218 and the cover plate 220, and is in contact with the color filter layer 110 that extends on the sidewall surface 100c of the substrate 100. The color filter layer 222 includes a material that is the same as or similar to that of the color filter layer 110 in the chip package 10 shown in FIG. 1.

In some embodiments, similar to the protective layer 112 in the chip package 10 shown in FIG. 1, a protective layer 224 covers the color filter layer 222 to prevent the color filter layer 222 from damage. The protective layer 224 includes an opening corresponding to the opening 226 of the color filter layer 222, so that the protective layer 224 surrounds the sensing region 102 (and the sensing device therein) of the substrate 100 via the opening of the protective layer 224. The protective layer 224 may extend onto the sidewalls 226a of the opening 226. The protective layer 224 may include a material that is the same as or similar to that of the protective layer 112.

In some embodiments, the passivation layer 126 is made of a material that is the same as the material of the color filter layer 130. In those cases, there is not the color filter layer 130 formed in the chip package 20. In some other embodiments, the color filter layer 130 and the redistribution layer 124 are formed by defining the same material (e.g., metal) layer, so that the color filter layer 130 and the redistribution layer 124 are formed between the insulating liner 122 and the passivation layer 126 and separated from each other. In some other embodiments, the color filter layer 130 is formed on the insulating liner 122 on the lower surface 100b of the substrate 100, so that the color filter layer 130 is formed between the insulating liner 122 and the redistribution layer 124.

In some embodiments, similar to the chip package 10a shown in FIG. 3, the sidewalls of the openings 101 of the substrate 100 in chip package 20 have multi-step profile, as the openings 101b of the chip package 10a shown in FIG. 3.

In some embodiments mentioned above, the chip package 20 includes an FSI sensing device. However, in other embodiments, the chip package 20 includes a BSI sensing device.

Figure 5A:
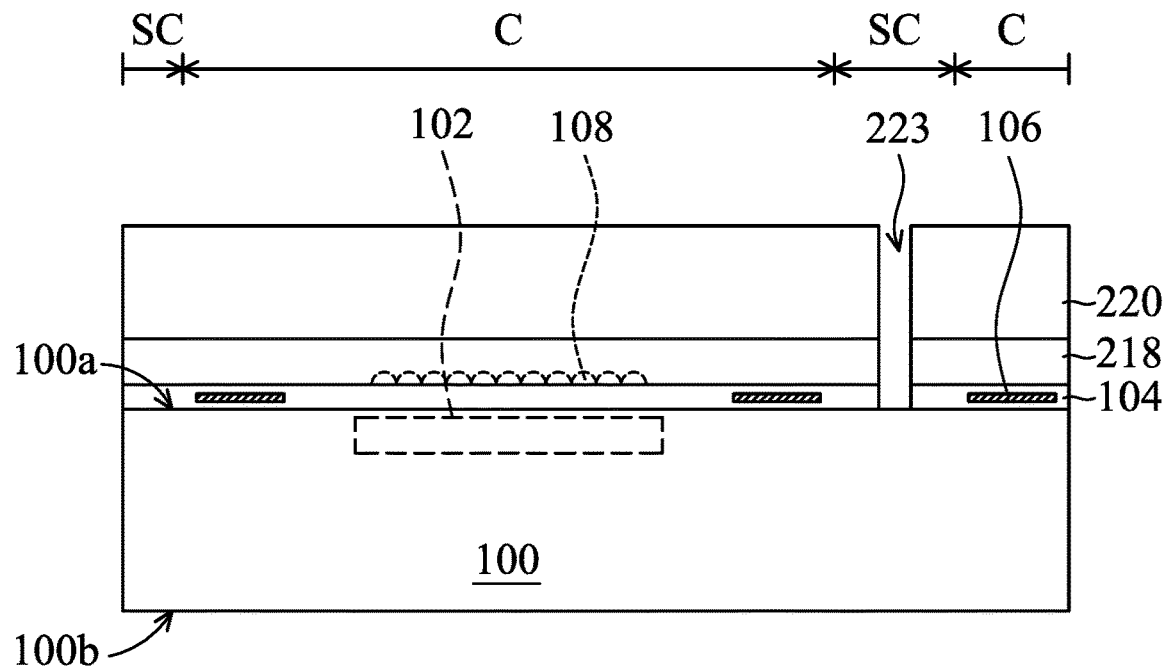
FIGS. 5A to 5F are cross-sectional views of a method for forming a chip package according to some embodiments of the invention.

FIGS. 5A to 5F are cross-sectional views of a method for forming a chip package 20 according to some embodiments of the invention. Elements in FIGS. 5A to 5F that are the same as those in FIGS. 2A to 2J and FIG. 4 are labeled with the same reference numbers as in FIGS. 2A to 2J and FIG. 4 and are not described again for brevity. Refer to FIG. 5A, a structure as shown in FIG. 2A is provided. Afterwards, a cover plate 220 is provided. In some embodiments, the cover plate 220 is employed to provide functions of protection and support and has a thickness that is in a range from about 100 μm to about 400 μm. The cover plate 220 is bonded onto the insulating layer 104 on the substrate 100 via an adhesive layer 218, so that the adhesive layer 218 and the cover plate 220 are formed on the upper surface 100a of the substrate 100. The adhesive layer 218 entirely covers the optical element 108 and the upper surface 100a of the substrate 100, so that there is not a cavity formed between the substrate 100 and the cover plate 220. As a result, the adhesive layer 218 is formed between the upper surface 100a of the substrate 100 and the cover plate 220, and the adhesive layer 218 and the he cover plate 220 cover the sensing device in the substrate 100.

In some embodiments, after the cover plate 220 is bonded onto the substrate 100, a dicing process is performed to form an opening 223 that is over the substrate at the scribe line region SC of and passes through the cover plate 220, the adhesive layer 218, and the insulating layer 104. As a result, the opening 223 surrounds the chip region C of the substrate 100.

Figure 5B:
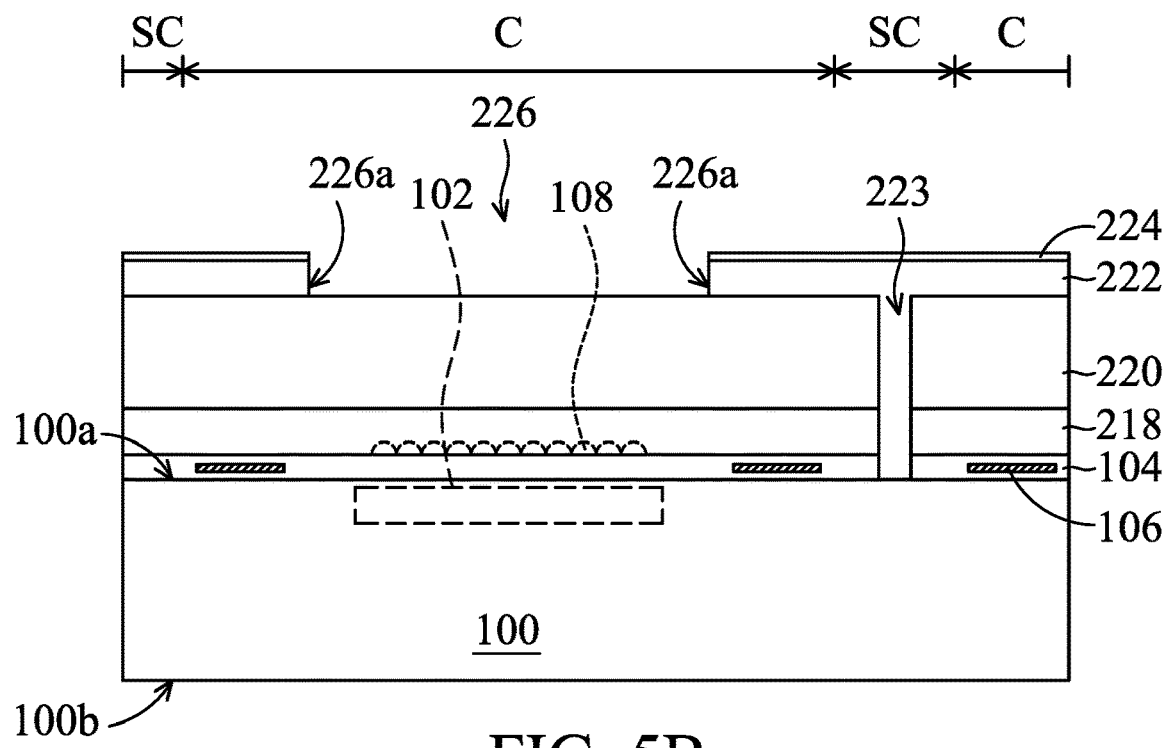

Refer to FIG. 5B, in some embodiments, a color filter layer 222 and a protective layer 224 are successively formed on the cover plate 220 by a similar formation method of the color filter layer 110 and a protective layer 112 shown in FIG. 2B. As a result, the cover plate 220 is formed between the adhesive layer 218 and the color filter layer 222, and the formed color filter layer 222 extends into the opening 223. In some embodiments, the color filter layer 222 has an opening 226, so that the color filter layer 222 surrounds the sensing device of the substrate 100 via the opening 226. The protective layer 224 may extends the sidewall 226a of the opening 226 of the color filter layer 222.

Figure 5C:
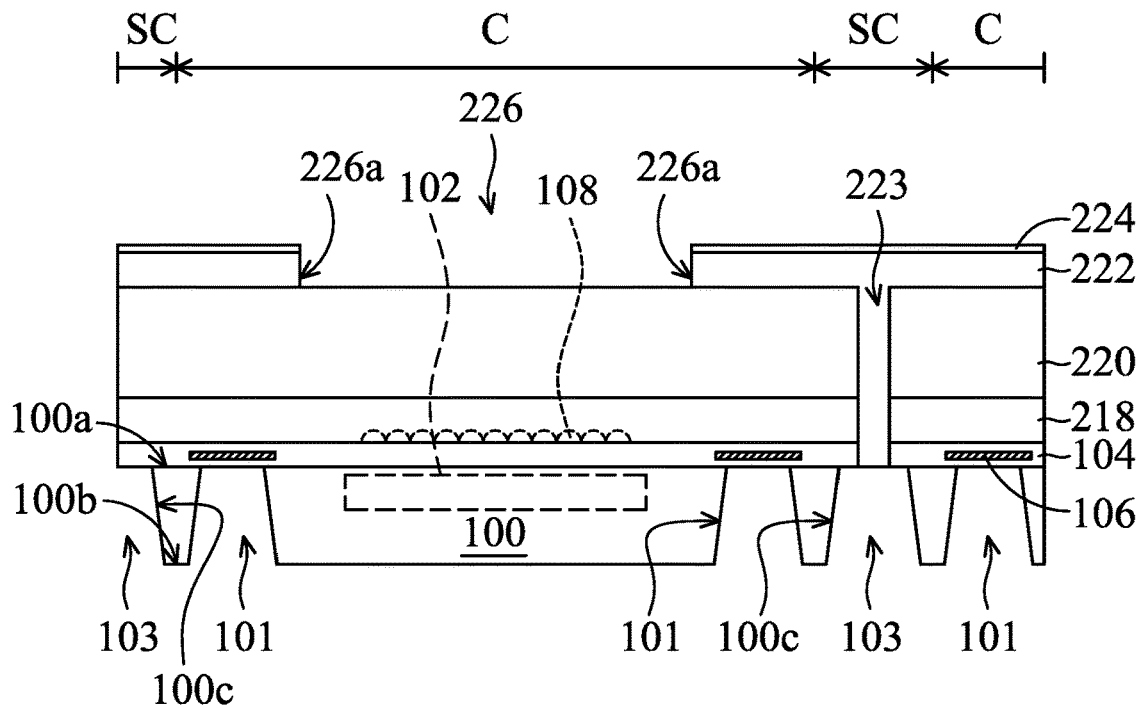

Refer to FIG. 5C, in some embodiments, a thinning process (such as an etching process, a milling process, a grinding process or a polishing process) is performed on the lower surface 100b of the substrate 100 by using the cover plate 220 as a carrier substrate, to reduce the thickness of the substrate 100. In some embodiments, the substrate has a thickness in a range from about 100 μm to about 200 μm after the thinning process.

Afterwards, openings 101 are formed in the substrate 100 at each of the chip regions C, and an opening 103 is formed in the substrate 100 at the scribe line region SC by a method that is the same as or similar to the method shown in FIG. 2D. The openings 101 expose the conductive pads 106 and the opening 103 expose the insulating layer 104 and extends to the color filter layer 222 in the opening 223. In some embodiments, the opening 103 extends along the scribe line region SC between the adjacent chip regions C to surround the chip region C. In some embodiments, the sidewalls of the openings 101 have a multi-step profile, as the opening 101b of the chip package 10a shown in FIG. 3.

Figure 5D:
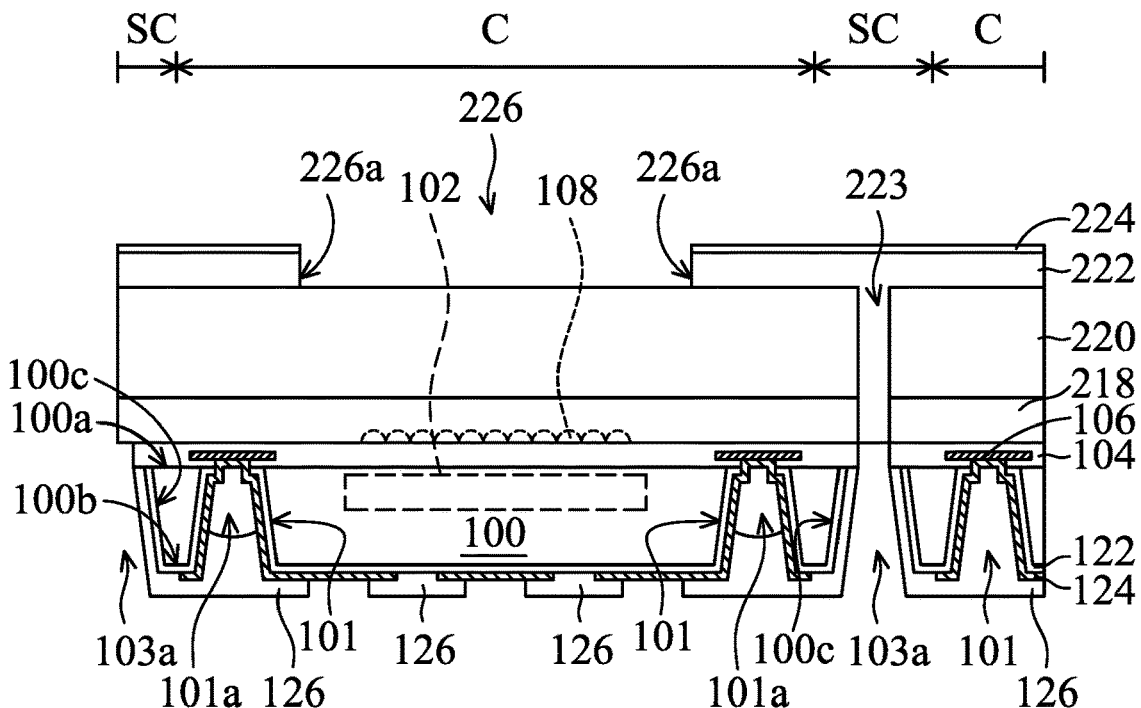

Refer to FIG. 5D, in some embodiments, an insulating liner 122, a redistribution layer 124, and a passivation layer 126 are successively formed on the lower surface 100b of the substrate 100, a hole 101a is formed between the redistribution layer 124 and a passivation layer 126 in each opening 101, and an opening 103a is formed in the passivation layer 126 in the opening 103 to expose the color filter layer 222 by methods that are the same as or similar to the methods shown in FIGS. 2E to 2G.

Figure 5E:
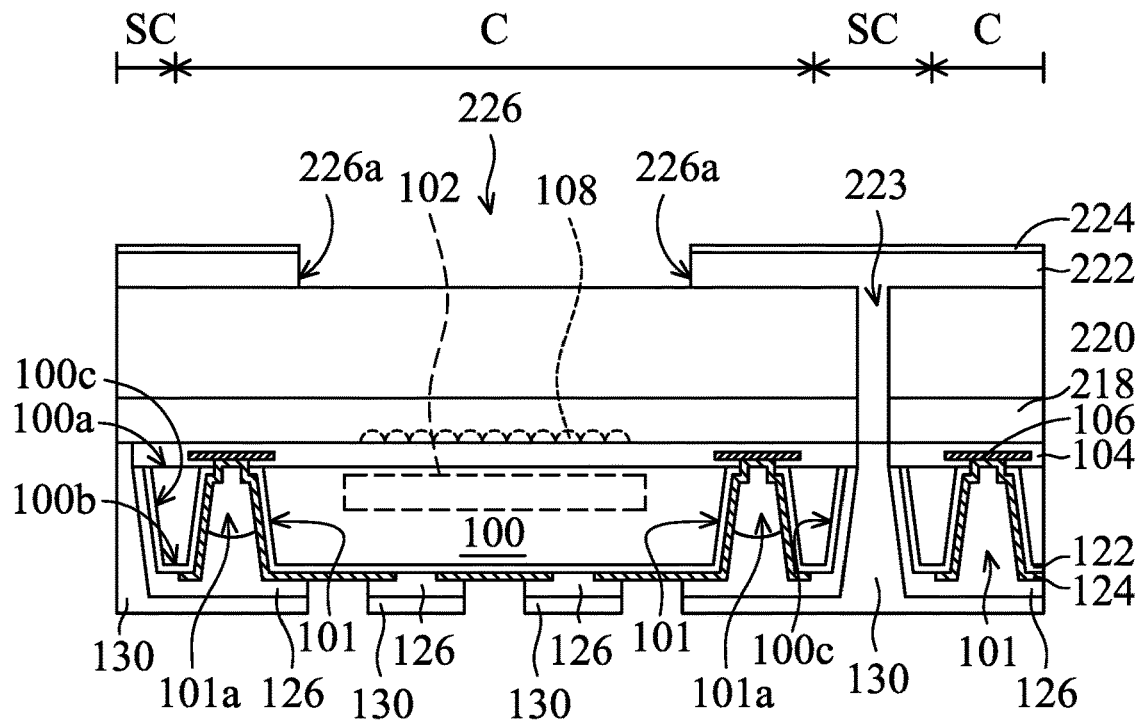

Refer to FIG. 5E, in some embodiments, an optional color filter layer 130 is formed on the passivation layer 126 and the redistribution layer 124 and extends into the opening 103a (as indicated in FIG. 2G) to be in contact with the color filter layer 222 by a method that is the same as or similar to the method shown in FIG. 2H. Afterwards, openings are formed in the color filter layer 130. These openings correspond to the openings that are in the passivation layer 126 and expose the redistribution layer 124.

Figure 5F:
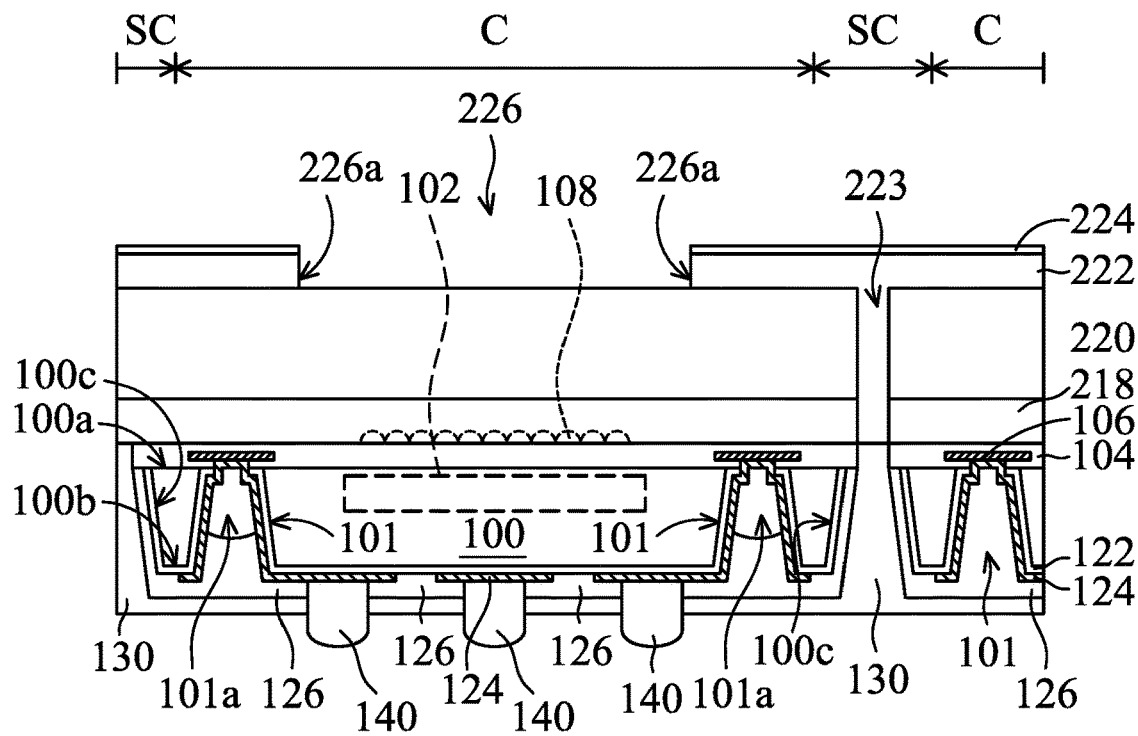

Refer to FIG. 5F, in some embodiments, conductive structures 140 are filled in the openings of the color filter layer 130 and the passivation layer 126 by a method that is the same as or similar to the method shown in FIG. 2I, so as to be electrically connected to the exposed redistribution layer 124. In some other embodiments, there are not conductive structures 140 formed in the openings in color filter layer 130 and the passivation layer 126.

Afterwards, the substrate 100 at the scribe line region SC and the films overlying and underlying the substrate 100 at the scribe line region SC are diced, thereby separating the substrate 100 in each of the chip regions C. For example, a dicing saw or laser may be used to perform the dicing process. After the dicing process is performed, individual chip packages 20 are formed, as shown in FIG. 4.

It should be realized that although the embodiments of FIGS. 5A to 5F provide a method for forming a chip package with an FSI sensing device, the method for forming the external electrical connection paths of the chip (such as the opening in the substrate, the redistribution layer, the protective layer, or the conductive structures therein) can be implemented to the processes of a BSI sensing device.

Figure 6:
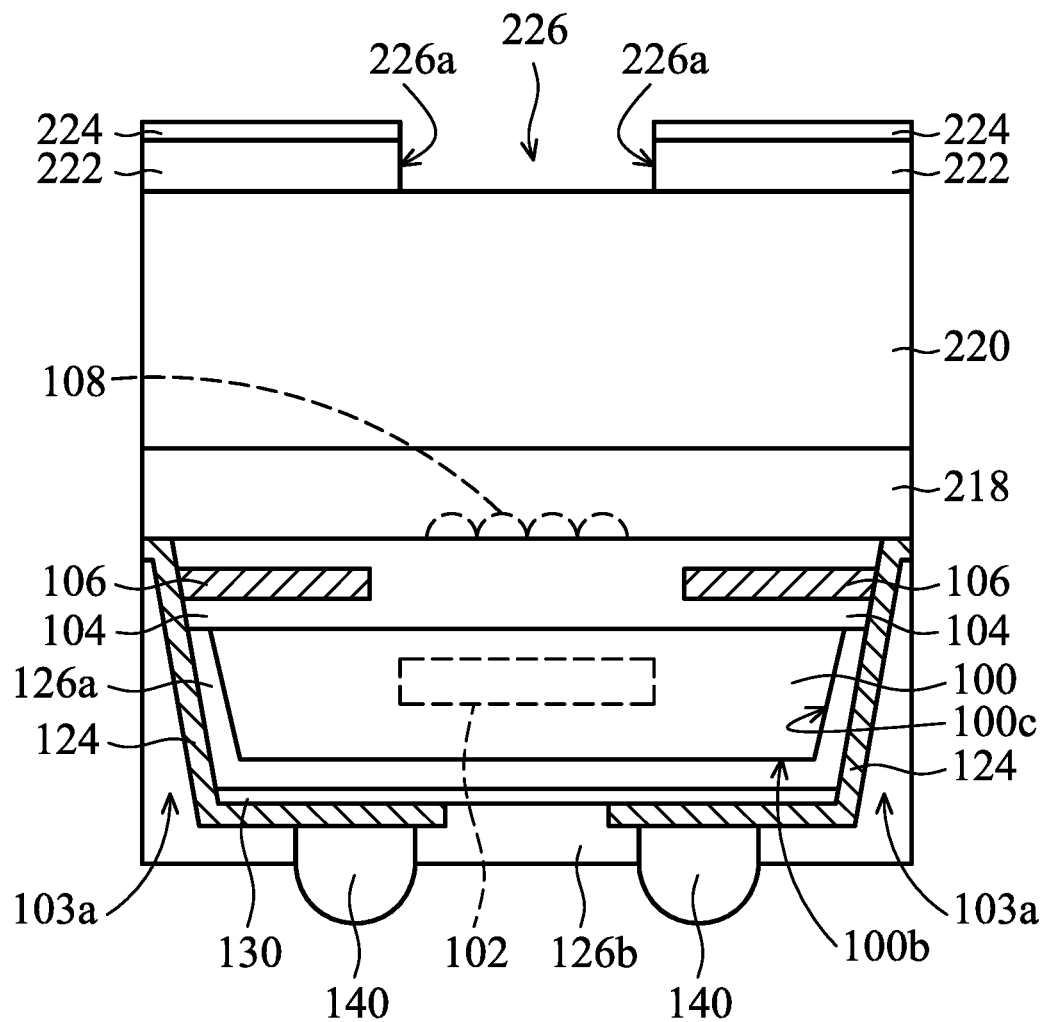
FIG. 6 is a cross-sectional view of a chip package according to some embodiments of the invention.

Refer to FIG. 6, which is cross-sectional view of a chip package 30 according to some embodiments of the invention. Elements in FIG. 6 that are the same as those in FIG. 4 are labeled with the same reference numbers as in FIG. 4 and are not described again for brevity. Unlike the structure of the chip package 20 shown in FIG. 4, the color filter layer 222 does not extend on the sidewalls of the adhesive layer 218 and the cover plate 220. Moreover, the structure of the chip package 30 does not have the openings 101 and the through substrate vias formed in the openings 101 as shown in the chip package 20. In addition, the structure of the chip package 30 does not have insulating liner 122 as shown in the chip package 20. Moreover, the conductive pads 106 laterally protrude from the sidewall surface 100c of the substrate 100. Therefore, the conductive pads 106 of the chip package 30 are also referred to as extended pads.

In some embodiments, the chip package 30 includes a passivation layer 126a that is disposed on the lower surface 100b of the substrate 100 and extends onto the sidewall surface of the substrate 100. The material of the passivation layer 126a may be the same as or similar to the material of the passivation layer 126 of the chip package 20 shown in FIG. 4. Moreover, the redistribution layer 124 is disposed on the passivation layer 126a and extends from the lower surface 100b of the substrate 100 to the sidewall surface 100c of the substrate 100 and the sidewall of the insulating layer 104, so that the redistribution layer 124 is electrically connected to the conductive pads 106 by using the T-contact method.

In some embodiments, the color filter layer 130 of the chip package 30 is disposed between the redistribution layer 124 and the passivation layer 126a, so that the passivation layer 126a is disposed between the color filter layer 130 and the lower surface 100b of the substrate 100. In some other embodiments, the material of the passivation layer 126a is the same as or similar to the material of the color filter layer 130. In those cases, there is not the color filter layer 130 formed between the redistribution layer 124 and the passivation layer 126a.

In some embodiments, the chip package 30 further includes a passivation layer 126b that covers the passivation layer 126a and the redistribution layer 124 and extends on the sidewall surface 100c of the substrate 100. The material of the passivation layer 126b may be the same as or similar to the material of the passivation layer 126 in the chip package 20 shown in FIG. 4. Moreover, the passivation layer 126b may include openings to expose the redistribution layer 124.

In some embodiments, the color filter layer 130 and the redistribution layer 124 are formed by defining the same material (e.g., metal) layer, so that the color filter layer 130 and the redistribution layer 124 are formed between the passivation layer 126a and the passivation layer 126b and separated from each other. In some other embodiments, the color filter layer 130 is formed on the passivation layer 126b and extends on the sidewall surface 100c of the substrate 100.

In some embodiments mentioned above, the chip package 30 includes an FSI sensing device. However, in other embodiments, the chip package 30 includes a BSI sensing device.

Figure 7A:
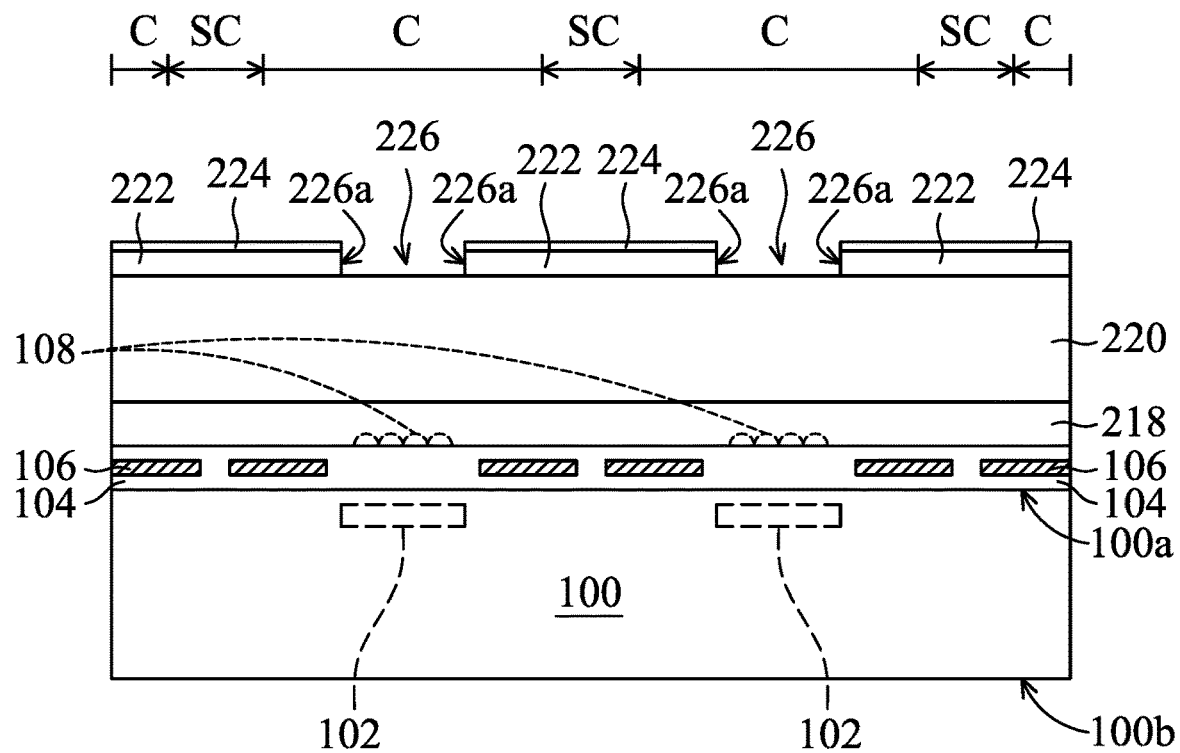
FIGS. 7A to 7G are cross-sectional views of a method for forming a chip package according to some embodiments of the invention.

FIGS. 7A to 7G are cross-sectional views of a method for forming a chip package 30 according to some embodiments of the invention. Elements in FIGS. 7A to 7G that are the same as those in FIGS. 5A to 5F are labeled with the same reference numbers as in FIGS. 5A to 5F and are not described again for brevity. Refer to FIG. 7A, a structure similar to the structure as shown in FIG. 5B is provided. Unlike the structure shown in FIG. 5B, there is not an opening 223 formed over the scribe line region SC to pass through the cover plate 220, the adhesive layer 218 and the insulating layer 104. Moreover, the conductive pads 106 in the insulating layer 104 extend from the chip region C to the scribe line region SC.

Figure 7B:
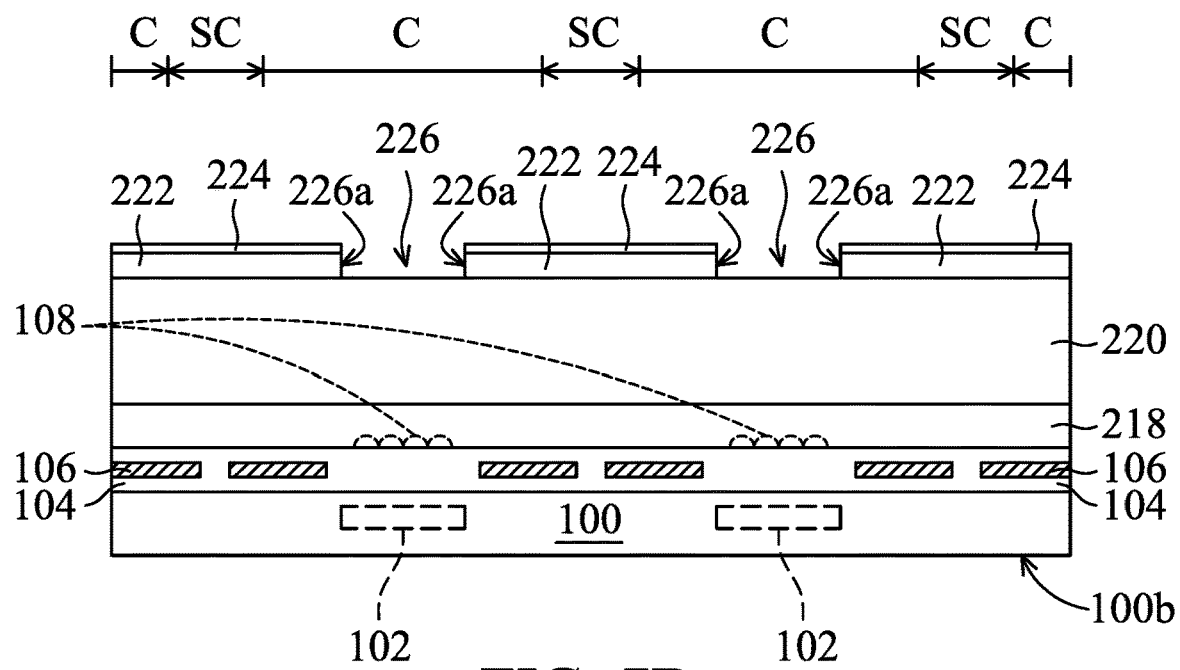

Refer to FIG. 7B, in some embodiments, a thinning process (such as an etching process, a milling process, a grinding process or a polishing process) is performed on the lower surface 100b of the substrate 100 by using the cover plate 220 as a carrier substrate, to reduce the thickness of the substrate 100. In some embodiments, the substrate has a thickness in a range from about 100 μm to about 200 μm after the thinning process.

Figure 7C:
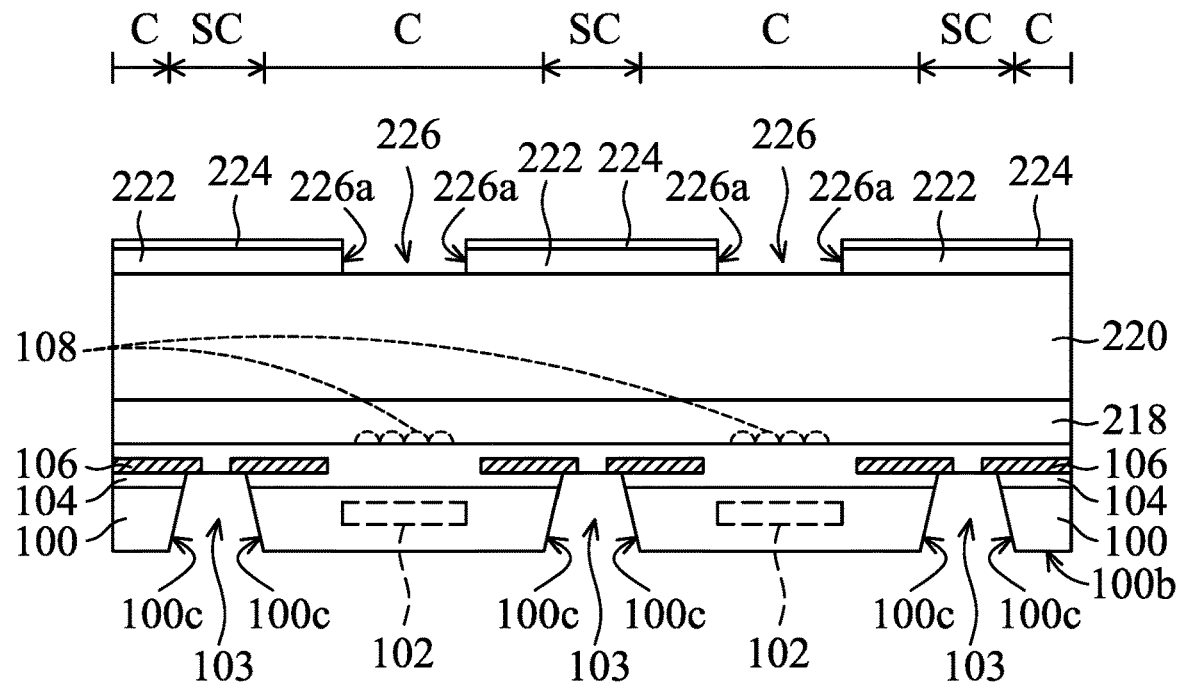

Refer to FIG. 7C, in some embodiments, an opening 103 is formed in the substrate 100 at the scribe line region SC by a method that is the same as or similar to the method shown in FIG. 5C, so as to expose the insulating layer 104. In some embodiments, the opening 103 extends along the scribe line region SC between the adjacent chip regions C to surround the chip region C.

Figure 7D:
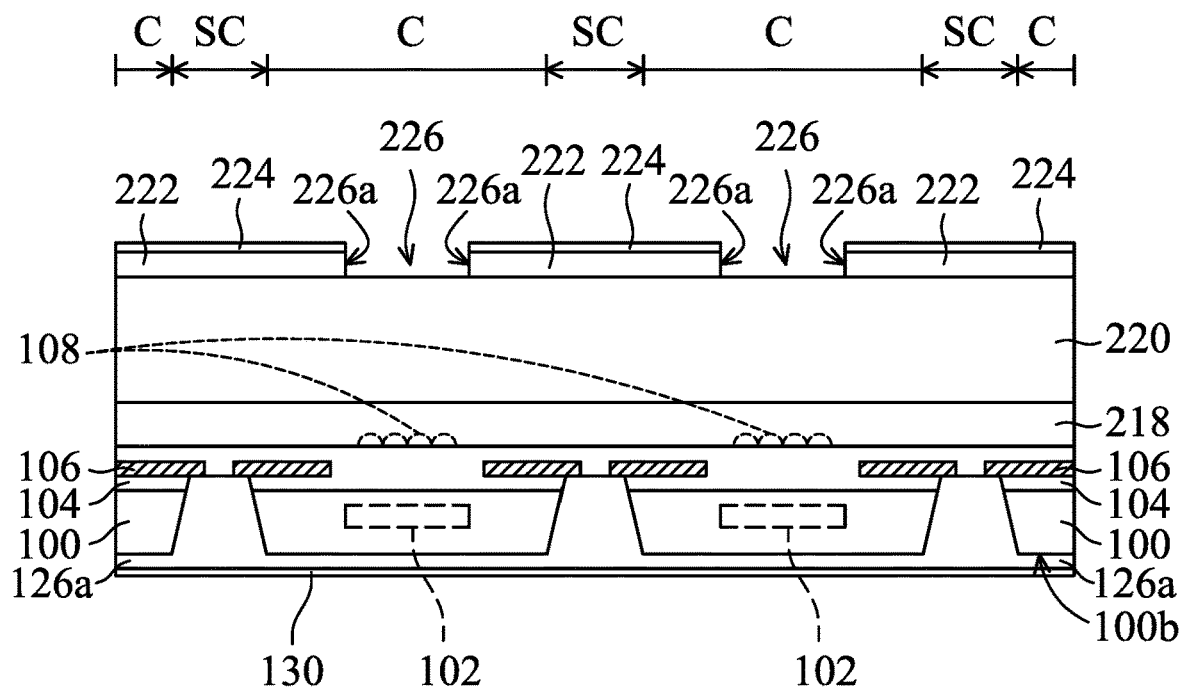

Refer to FIG. 7D, in some embodiments, a passivation layer 126a is formed on the lower surface 100b of the substrate 100 and entirely fills the opening 103 by a method that is the same as or similar to the method shown in FIG. 5D. Afterwards, an optional color filter layer 130 is formed on the passivation layer 126a by a method that is the same as or similar to the method shown in FIG. 5E, so that the passivation layer 126a is formed between the color filter layer 130 and the substrate 100. In some other embodiments, the material of the passivation layer 126a is the same as or similar to the material of the color filter layer 130. In those cases, there is not the color filter layer 130 formed on the passivation layer 126a.

Figure 7E:
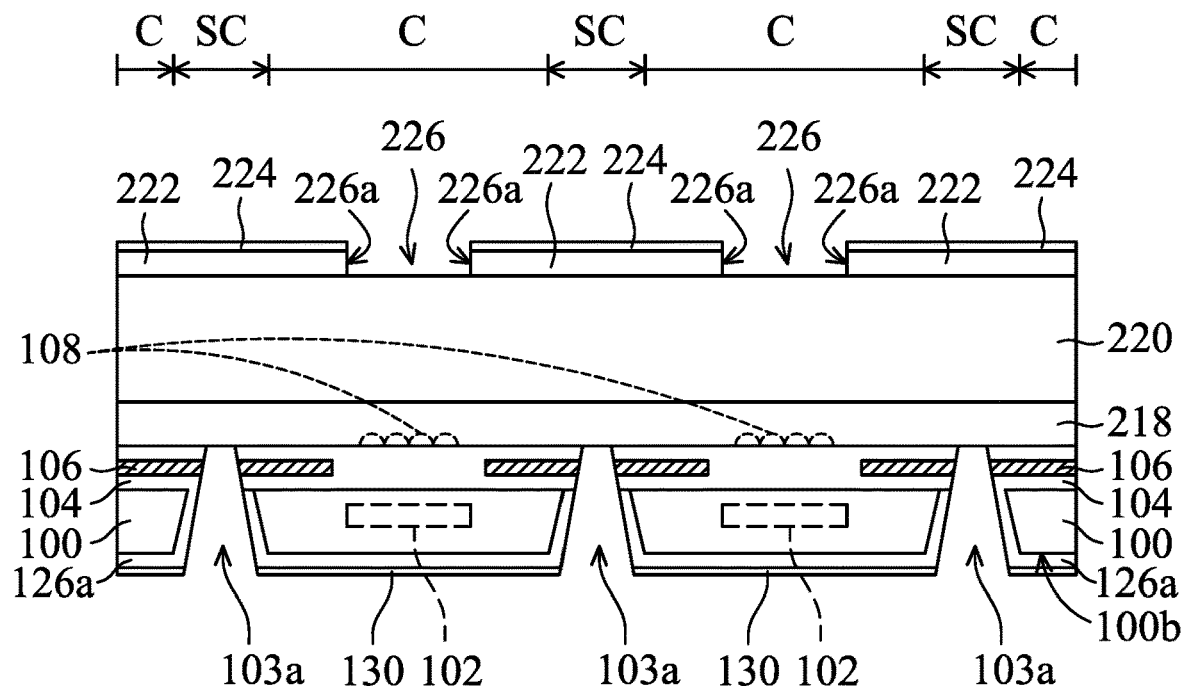
Figure 7F:
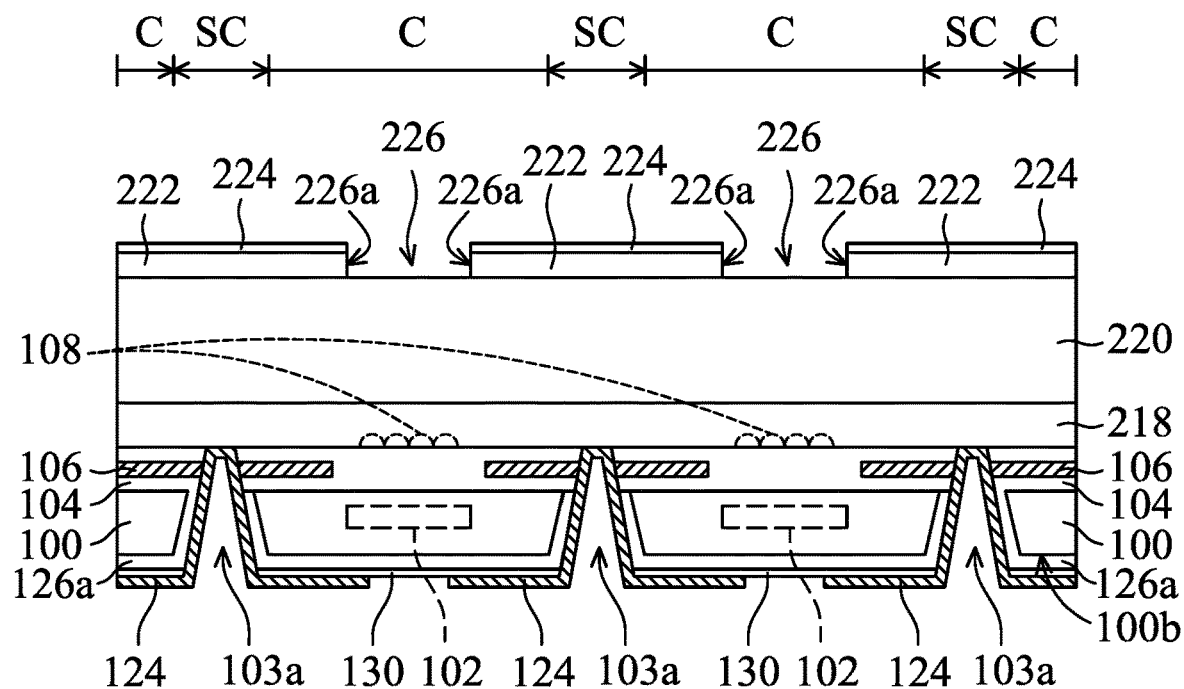

In some embodiments, an opening 103a is formed in the passivation layer 126a in the opening 103, and a redistribution layer 124 is formed on the color filter layer 130 by a method that is the same as or similar to the method shown in FIG. 5D, so that the color filter layer 130 is formed between the redistribution layer 124 and the substrate 100. The formed opening 103a exposes the adhesive layer 218 and the sidewalls of the conductive pads 106 in the insulating layer 104 (as shown in FIG. 7E), and the redistribution layer 124 extends into the opening 103a, so as to electrically contact the exposed sidewalls of the conductive pads 106 (as shown in FIG. 7F).

Figure 7G:
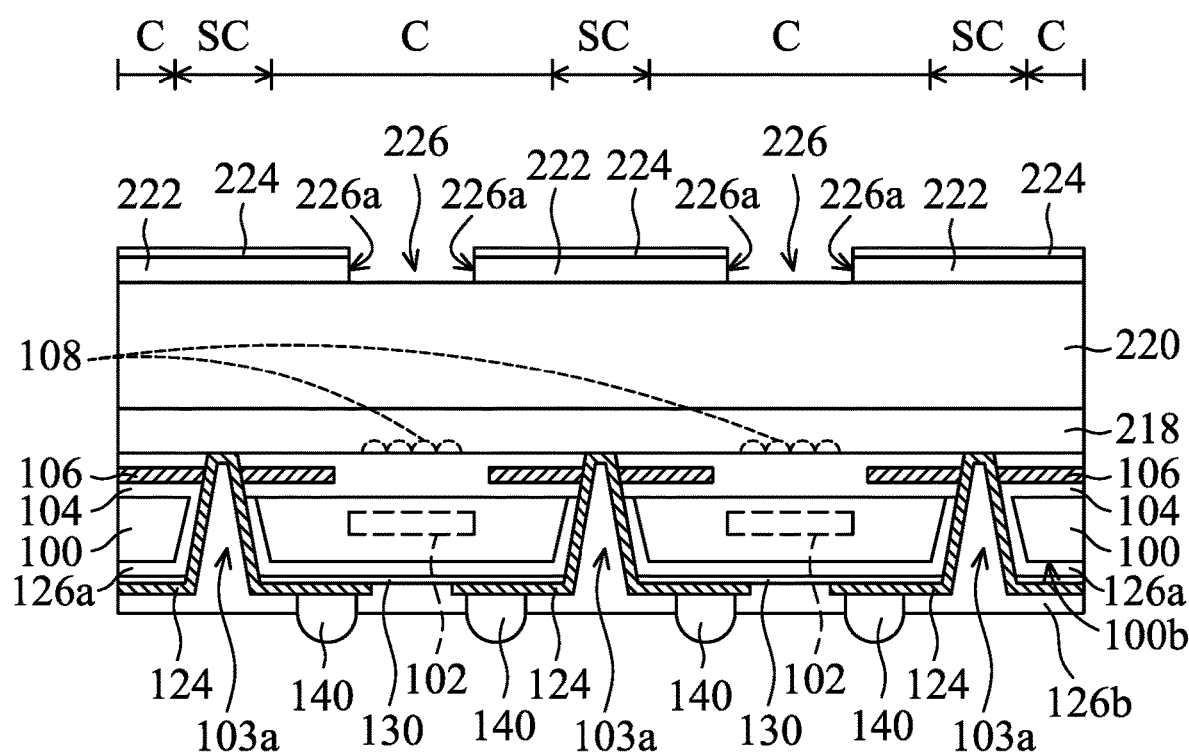

Refer to FIG. 7G, in some embodiments, a passivation layer 126b is formed by using a material and a method that are the same as or similar to those used for the passivation layer 126a, so as to cover the color filter layer 130 and the redistribution layer 124.

Next, conductive structures 140 are filled in the openings of the passivation layer 126a by a method that is the same as or similar to the method shown in FIG. 5F, so as to be electrically connected to the exposed redistribution layer 124. In some other embodiments, there are not conductive structures 140 formed in the openings in the passivation layer 126b.

Afterwards, the substrate 100 at the scribe line region SC and the films overlying and underlying the substrate 100 at the scribe line region SC are diced, thereby separating the substrate 100 in each of the chip regions C. For example, a dicing saw or laser may be used to perform the dicing process. After the dicing process is performed, individual chip packages 30 are formed, as shown in FIG. 6.

It should be realized that although the embodiments of FIGS. 7A to 7G provide a method for forming a chip package with an FSI sensing device, the method for forming the external electrical connection paths of the chip (such as the opening in the substrate, the redistribution layer, the protective layer, or the conductive structures therein) can be implemented to the processes of a BSI sensing device.

According to the aforementioned embodiments, since the color filter layers respectively cover the upper surface and the lower surface of the substrate, undesired light source that passes through the substrate of the sensing chip can be shielded or absorbed, thereby preventing the sensing region in the substrate from being impacted. As a result, optical crosstalk problems can be addressed or improved, thereby improving or maintaining the quality of the chip package with a sensing chip.

While the invention has been disclosed in terms of the preferred embodiments, it is not limited. The various embodiments may be modified and combined by those skilled in the art without departing from the concept and scope of the invention.

What is claimed is:

1. A chip package, comprising:
a substrate having an upper surface, a lower surface, and a sidewall surface that is at an edge of the substrate, wherein the substrate comprises a sensing device adjacent to the upper surface of the substrate to sense a light source;
a first color filter layer disposed on the upper surface of the substrate to shield the light source, wherein the first color filter layer comprises an opening, so that the first color filter layer surrounds the sensing device via the opening;
a redistribution layer disposed on the lower surface of the substrate; and
a second color filter layer covering the redistribution layer, wherein the second color filter layer comprises a plurality of openings to expose the redistribution layer.

2. The chip package as claimed in claim 1, wherein the second color filter layer covers the sidewall surface of the substrate.

3. The chip package as claimed in claim 1, further comprising:
an insulating liner disposed between the redistribution layer and the substrate; and
a passivation layer disposed between the redistribution layer and the second color filter layer.

4. The chip package as claimed in claim 1, further comprising a plurality of conductive structures correspondingly disposed in the plurality of openings of the second color filter layer to be electrically connected to the redistribution layer.

5. The chip package as claimed in claim 1, wherein the substrate further comprises a plurality of openings that extend from the lower surface of the substrate toward the upper surface of the substrate, wherein the redistribution layer extends into the plurality of openings of the substrate.

6. The chip package as claimed in claim 5, wherein sidewalls of the plurality of openings of the substrate respectively have a multi-step profile.

7. The chip package as claimed in claim 1, further comprising an optical element disposed on the upper surface of the substrate and in the opening of the first color filter layer.

8. A chip package, comprising:
a substrate having an upper surface, a lower surface, and a sidewall surface that is at an edge of the substrate, wherein the substrate comprises a sensing device adjacent to the upper surface of the substrate to sense a light source;
a first color filter layer disposed on the upper surface of the substrate to shield the light source, wherein the first color filter layer comprises an opening, so that the first color filter layer surrounds the sensing device via the opening;
a redistribution layer disposed on the lower surface of the substrate; and
a protective layer covering the first color filter layer and including an opening corresponding to the opening of the first color filter layer, so that the protective layer surrounds the sensing device via the opening of the protective layer.

9. The chip package as claimed in claim 8, wherein the protective layer extends onto a sidewall of the opening of the first color filter layer.

10. A chip package, comprising:
a substrate having an upper surface, a lower surface, and a sidewall surface that is at an edge of the substrate, wherein the substrate comprises a sensing device adjacent to the upper surface of the substrate to sense a light source;
a first color filter layer disposed on the upper surface of the substrate to shield the light source, wherein the first color filter layer comprises an opening, so that the first color filter layer surrounds the sensing device via the opening;
a redistribution layer disposed on the lower surface of the substrate;
a cover plate disposed between the upper surface of the substrate and the first color filter layer; and
an adhesive layer disposed between the upper surface of the substrate and the cover plate, wherein the adhesive layer and the cover plate cover the sensing device.

11. The chip package as claimed in claim 10, wherein the first color filter layer extends onto sidewalls of the adhesive layer and the cover plate.

12. The chip package as claimed in claim 11, further comprising a second color filter layer covering the redistribution layer and extending on the sidewall surface of the substrate to contact the first color filter.

13. The chip package as claimed in claim 10, further comprising a second color filter layer disposed between the redistribution layer and the substrate.

14. The chip package as claimed in claim 13, further comprising a first passivation layer disposed between the second color filter layer and the substrate and extending on the sidewall surface of the substrate.

15. The chip package as claimed in claim 14, further comprising a second passivation layer covering the second color filter layer and the redistribution layer and extending on the sidewall surface of the substrate, wherein the second passivation layer comprises a plurality of openings that expose the redistribution layer.

16. The chip package as claimed in claim 15, further comprising a plurality of conductive structures correspondingly disposed in the plurality of openings of the second passivation layer to be electrically connected the redistribution layer.

17. The chip package as claimed in claim 10, further comprising at least one conductive pad disposed on the upper surface of the substrate and laterally protruding from the sidewall surface of the substrate, wherein the redistribution layer extends from the lower surface of the substrate to the sidewall surface of the substrate, so as to electrically contact the at least one conductive pad.

* * * * *